(12) United States Patent
Yamakoshi

(10) Patent No.: US 10,958,269 B2
(45) Date of Patent: Mar. 23, 2021

(54) BRIDGE OUTPUT CIRCUIT, POWER DEVICE AND SEMICONDUCTOR DEVICE

(71) Applicant: Rohm Co., Ltd., Kyoto (JP)

(72) Inventor: Haruo Yamakoshi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/778,317

(22) Filed: Jan. 31, 2020

(65) Prior Publication Data

US 2020/0252062 A1    Aug. 6, 2020

(30) Foreign Application Priority Data

Feb. 5, 2019 (JP) .............................. JP2019-018917

(51) Int. Cl.
*H03K 17/687* (2006.01)
*H02M 3/158* (2006.01)
*H02M 1/088* (2006.01)

(52) U.S. Cl.
CPC ........ *H03K 17/6871* (2013.01); *H02M 1/088* (2013.01); *H02M 3/158* (2013.01)

(58) Field of Classification Search
CPC .. H03K 17/56; H03K 17/687; H03K 17/6871; H03K 17/6872; H03K 17/6874; H02M 1/08; H02M 1/088; H02M 1/092; H02M 1/096; H02M 3/10; H02M 3/145; H02M 3/155; H02M 3/156; H02M 3/158; H02M 3/1582; H02M 3/1584; H02M 3/1588; H02M 2003/1586
See application file for complete search history.

(56) References Cited

U.S. PATENT DOCUMENTS 5,408,150 A * 4/1995 Wilcox ................... H02M 1/38
326/104
9,024,558 B2 * 5/2015 Sugie ................... H03K 17/165
318/400.26

FOREIGN PATENT DOCUMENTS

JP        2011-055470        3/2011

\* cited by examiner

*Primary Examiner* — Diana J. Cheng
(74) *Attorney, Agent, or Firm* — Fish & Richardson P.C.

(57) ABSTRACT

A bridge output circuit of the present invention reduces the dead time.
Upon receiving an input signal ($S_{IN}$) for indicating on state of a high-side transistor (1H), a gate control signal generation circuit (4) outputs a low-side gate control signal (LGCTL) for turning off a low-side transistor (1L) to a low-side driver circuit (2L). On the other hand, a high-side gate control signal (HGCTL) for turning on the high-side transistor is generated from a signal delayed the low-side gate control signal and outputted to a high-side driver circuit (2H). The time of delay is controlled by the input signal ($S_{IN}$), a signal (LGFB) indicating on/off state of the low-side transistor, and a signal ($S_{OUT\_L}$) indicating a level of an output signal.

11 Claims, 12 Drawing Sheets

BRIDGE OUTPUT CIRCUIT, POWER DEVICE AND SEMICONDUCTOR DEVICE

BACKGROUND OF THE INVENTION

Field of the Invention

The present invention relates to a bridge output circuit, a power device, and a semiconductor device.

Description of the Prior Art

FIG. 15 shows a structure of a bridge output circuit including a half-bridge circuit 901. The half-bridge circuit 901 includes serially connected transistors 901H and 901L serving as a pair of switching elements. In the bridge output circuit of FIG. 15, the transistors 901H and 901L are alternately turned on and turned off. However, in order to reliably prevent the transistors 901H and 901L from simultaneously being in on state, there is a period in which they are both turned off and the period is referred to as dead time (a dead time period).

In general, the following method is used; that is, the gate voltage of one of the transistors is used as a feedback signal, and one of the transistors is turned on upon having determined off state of the other transistor.

PRIOR ART DOCUMENT

Patent Publication

[Patent document 1] Japan Patent Publication No. 2011-55470

SUMMARY OF THE INVENTION

Problems to be Solved by the Invention

Dead time is needed in order to suppress shoot-through current generated by a pair of transistors connected in series and simultaneously turned on. However, the increase of the dead time causes an increase in the toss of a bridge output circuit or loss of a device having a bridge output circuit. Therefore, preferably, the dead time needs to be minimized while suppressing the shoot-through current.

It is an object of the present invention to provide a bridge output circuit, a power device and a semiconductor device that reduce the dead time.

Technical Features for Solving the Problem

A bridge output circuit of the present invention receiving an input signal and outputting an output signal corresponding to the input signal from an output terminal, including: a first transistor, provided between a first power terminal and the output terminal, a second transistor, provided between the output terminal and a second power terminal; a first detection circuit, detecting on/off state of the first transistor according to a first gate signal serving as a gate signal of the first transistor, and outputting a first detection signal indicating detection result; a second detection circuit, detecting on/off state of the second transistor according to a second gate signal serving as a gate signal of the second transistor, and outputting a second detection signal indicating detection result; a gate control signal generation circuit, generating a first gate control signal and a second gate control signal according to the input signal, the first detection signal and the second detection signal in a way that the first transistor and the second transistor do not simultaneously become on-state; a first driver circuit, supplying the first gate signal to the first transistor according to the first gate control signal; and a second driver circuit, supplying the second gate signal to the second transistor according to the second gate control signal; wherein, the input signal alternates between an output-on instruction level and an output-off instruction level, the output-on instruction level indicates that the first transistor is set to be on state and tire second transistor is set to be off state, and the output-off instruction level indicates that the first transistor is set to be off state and the second transistor is set to be on state, when the first transistor is in off state and the second transistor is in on state, the output-off instruction level is switching to the output-on instruction level in the input signal, the gate control signal generation circuit generating the second gate control signal for setting the second transistor to off state, and generating the first gate control signal for setting the first transistor to on state from a signal that delayed the second gate control signal for setting the second transistor to off-state, and the gate control signal generation circuit controlling a time of the delay, that is a delay amount, according to a first delay control signal serving as the input signal, a second delay control signal indicating on/off state of the second transistor, and a third delay control signal indicating a level of the output signal or on/off state of the first transistor.

More specifically, for example, preferably, the gate control signal generation circuit is configured to decrease the delay amount when a predetermined condition is satisfied; and the predetermined condition is satisfied when the input signal serving as the first delay control signal is in the output-on instruction level, the second transistor is indicated as being in off state by the second delay control signal, and the level of the output signal is indicated as below a predetermined level or the first transistor is in off state by the third delay control signal.

More specifically, for example, preferably, the gate control signal generation circuit includes: an adjustment capacitor; an adjustment current output circuit, updating a terminal voltage of the adjustment capacitor by having an adjustment current flow through the adjustment capacitor during a period that the predetermined condition is satisfied; and a delay circuit, generating the first gate control signal for setting the first transistor to on state from a signal, the signal delayed the second gate control signal for setting the second transistor to off state by a time responding to the terminal voltage of the adjustment capacitor.

More specifically, for example, preferably, the delay circuit includes: a delay capacitor; and a circuit, supplying a predetermined current and a current corresponding to the terminal voltage of the adjustment capacitor to the delay capacitor from a timing of a level of the second gate control signal is switched from the level for setting the second transistor to on state to the level for setting the second transistor to off state, and the delay circuit generating the first gate control signal according to the terminal voltage of the delay capacitor.

Further, specifically, for example, preferably, the delay circuit decreases the delay amount from a predetermined initial delay amount following the terminal voltage of the adjustment capacitor deviates from a predetermined initial voltage as an accumulation amount of the adjustment current flowing through the adjustment capacitor increases.

At this point, for example, preferably, when the period that the predetermined condition is satisfied is generated decreasingly as the delay amount decreases, the terminal voltage of the adjustment capacitor is fixed and the delay amount is fixed.

Further, specifically, for example, preferably, the first driver circuit receives the first gate control signal for setting the first transistor to off state or on state, and supplies the first gate signal to the first transistor; and the second driver circuit receives the second gate control signal for setting the second transistor to off state or on state, and supplies the second gate signal to the second transistor.

A semiconductor device of the present invention forming the bridge output circuit, the bridge output circuit being formed by an integrated circuit.

A power device of die present invention including: the bridge output circuit; and an input signal generation circuit, generating the input signal according to a feedback voltage corresponding to a direct-current output voltage, wherein the direct-current output voltage is generated from a switching voltage serving as an output signal of the bridge output circuit.

Another semiconductor device of the present invention being a semiconductor device forming the power device, the power device being formed by an integrated circuit.

Effects of the Invention

A bridge output circuit, a power device and a semiconductor device that reduce the dead time are provided according to the present invention.

DETAILED DESCRIPTION OF THE EMBODIMENTS

Examples of embodiments of the present invention are specifically described with reference to the accompanying drawings below. In the reference drawings, the same part is represented by the same denotation, and repeated description of the same part is in principle omitted. Further, in the description, for brevity, information, signals, physical quantities or names of components corresponding to signs or symbols representing information, signals, physical quantities or components of denotation references may be omitted or abbreviated. For example, a high-side gate signal referred by "HG" sometimes represents a high-side gate signal HG, and is sometimes abbreviated as a gate signal HG or a signal HG, which however refer to the same matter.

Figure 1:
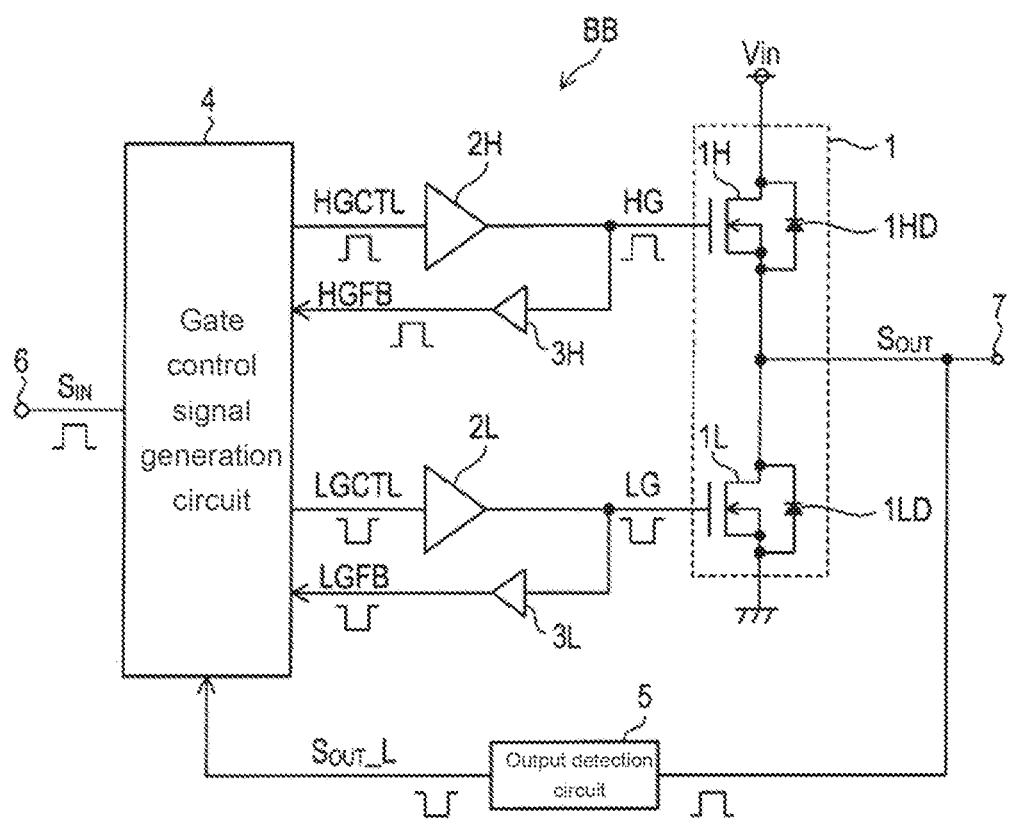
FIG. 1, is a structural diagram of a bridge output circuit according to an embodiment of the present invention.

FIG. 1 shows a structural diagram of a bridge output circuit BB according to an embodiment of the present invention. The bridge output circuit BB includes: a high-side transistor 1H and a low-side transistor 1L serving as voltage-controlled transistors, a high-side driver circuit 2H and a low-side driver circuit 2L, a high-side state detection circuit 3H and a low-side state detection circuit 3L, a gate control signal generation circuit 4, an output detection circuit 5, an input terminal 6, and an output terminal 7. An input signal $S_{IN}$ in rectangular waves is supplied from the exterior of the bridge output circuit BB to the input terminal 6, and a switching signal (equivalent to a switching voltage) in rectangular waves serving as an output signal $S_{OUT}$ and corresponding to the input signal $S_{IN}$ is applied to the output terminal 7.

Before the structure of FIG. 1 is described, some configuration terms are explained in advance.

In this embodiment, a so-called level refers to the level of a potential, and for any signal or voltage, a high level has a potential higher than that of a low level. A ground refers to a conductive portion of a 0 V reference potential or the reference potential itself. In this embodiment, a voltage indicated without a specific reference represents a potential observed from the ground.

In any signal or voltage, switching from a low level to a high level is referred to as a rising edge, and a timing of switching from a low level to a high level is referred to as a rising edge timing. Similarly, in any signal or voltage, switching from a high level to a low level is referred to as a falling edge, and a timing of switching from a high level to a low level is referred to as a falling edge timing.

For a transistor formed to be an FET including transistors 1H and 1L, on state refers to a connected state between the drain and the source of the transistor, and off state refers to a non-connected state (a blocked state) between the drain and the source of the transistor.

The transistors 1H and 1L are respectively formed by N-channel metal-oxide semiconductor field-effect transistors (MOSFETs), and the transistors 1H and 1L are connected in series to form a half-bridge circuit 1. More specifically, the drain of the transistor 1L is connected to a first power terminal applied with a supply voltage Vin to receive the supply voltage Vin, and the source of the transistor 1H and the drain of the transistor 1L are commonly connected to the output terminal 7. The supply voltage Vin is a predetermined positive direct-current voltage (e.g., 12 V). The source of the transistor 1L is connected to the ground serving the function of a second power terminal.

Diodes 1HD and 1LD shown in FIG. 1 are respectively parasitic diodes of the transistors 1H and 1L. The source and the drain of the transistor 1H are respectively connected to the anode and cathode of the diode 1HD, and the source and the drain of the transistor 1L are respectively connected to the anode and the cathode of the diode 1LD. However, the diodes 1HD and 1LD different from the parasitic diodes of the transistors 1H and 1L may also be provided.

The driver circuit 2H receives a high-side gate control signal HGCTL supplied from the gate control signal generation circuit 4 and supplies a high-side gate signal HG corresponding to the control signal HGCTL to the gate of the transistor 1H. Accordingly, the transistor 1H is set to any one state of on state and off state.

The driver circuit 2L receives a low-side gate control signal LGCTL supplied from the gate control signal generation circuit 4 and supplies a low-side gate signal LG corresponding to the control signal LGCTL to the gate of the transistor 1L. Accordingly, the transistor 1L is set to any one state of on state and off state.

The high-side state detection circuit 3H receives the high-side gate signal HG, and detects the transistor 1H is in on state or off state according to the high-side gate signal HG, and generates and outputs a high-side feedback signal HGFB indicating a detection result thereof to the gate control signal generation circuit 4.

The low-side state detection circuit 3L receives the low-side gate signal LG, detects the transistor 1L is in on slate or off slate according to the low-side gate signal LG and generates and outputs a low-side feedback signal LGFB indicating a detection result thereof to the gate control signal generation circuit 4.

The high-side driver circuit 2H outputs the gate signal HG in a high level when it receives the input of the gate control signal HGCTL in a high level, or outputs the gate signal HG in a low level when it receives the input of the gate control signal HGCTL in a low level.

The voltage of the gate signal HG is the gate voltage of the transistor 1H. When the level of the gate signal HG is high level, the gate-source voltage of the transistor 1H becomes more than a predetermined gate threshold voltage $V_{THH}$ (the gate cutoff voltage) corresponding to the characteristics of the transistor 1H, and the transistor 1H becomes on state. When the level of the gate signal HG is a low level, the gate-source voltage of the transistor 1H has not yet reached the gate threshold voltage $V_{THH}$, and the transistor 1H becomes off state.

The driver circuit 2H acts according to a high-side supply voltage (e.g., 17 V) higher than the voltage value of the supply voltage Vin and a low-side supply voltage having the voltage value of the output terminal 7, and the high level of the gate signal HG and the level of the high-side supply voltage are consistent, and the low level of the gate signal HG and the level of the low-side supply voltage (i.e., the level of the output signal $S_{OUT}$) are consistent.

The high-side state detection circuit 3H outputs the signal HGFB in a low level when the gate-source voltage of the transistor 1H (i.e., the potential of the gate observed from the potential of the source of the transistor 1H) has not yet reached the gate threshold voltage $V_{THH}$, and on the other conditions it outputs the signal HGFB in a high level. The signal HGFB in a low level serves as a signal indicating that the transistor 1H is in off state, and the signal HGFB in a high level serves as a signal indicating that the transistor 1H is in non-off state or indicating that the transistor 1H is in on state. Therefore, the detection circuit 3H may be considered as a circuit that detects whether the transistor 1H is in the state according to the high-side gate signal HG, or may be considered as a circuit that detects whether the transistor 1H is in on state according to the high-side gate signal HG. Further, the detection circuit 3H may also be a circuit which outputs the signal HGFB in a low level when the gate-source voltage of the transistor 1H has not yet reached a predetermined voltage $V_{THH}'$ that is lower than the gate threshold voltage $V_{THH}$, and on the other conditions it outputs the signal HGFB in a high level.

The low-side driver circuit 2L outputs the gate signal LG in a high level when it receives the input of the gate control signal LGCTL in a high level, or outputs the gate signal LG in a low level when it receives the input of the gate control signal LGCTL in a low level.

The voltage of the gate signal LG is the gate voltage of the transistor 1L. When the level of the gate signal LG is high level, the gate-source voltage of the transistor 1L becomes more than a predetermined gate threshold voltage $V_{THL}$ (the gate cutoff voltage) corresponding to the characteristics of the transistor 1L, and the transistor 1L becomes on state. When the level of the gate signal LG is a low level, the gate-source voltage of the transistor 1L has not yet reached the gate threshold voltage $V_{THL}$, and the transistor 1L becomes off state.

The driver circuit 2L acts according to a predetermined positive internal supply voltage (e.g., 5 V) and the ground voltage, and the high level of the gate signal LG and the level of the control supply voltage are consistent, and the low level of the gate signal LG and the potential of ground are consistent.

The low-side state detection circuit 3L outputs the signal LGFB in a low level when the gate-source voltage of the transistor 1L (i.e., the potential of the gate observed from the potential of the source of the transistor 1L) has not yet reached the gate threshold voltage $V_{THL}$, and on the other conditions it outputs the signal LGFB in a high level. The signal LGFB in a low level serves as a signal indicating that the transistor IL is in off stale, and the signal LGFB in a high level serves as a signal indicating that the transistor 1L is in non-off state or indicating that the transistor 1L is in on state. Therefore, the detection circuit 3L may be considered as a circuit that detects whether the transistor 1L is in off state according to the low-side gale signal LG, or may be considered as a circuit that detects whether the transistor 1L is in on state according to the low-side gate signal LG. Further, the detection circuit 3L may also be a circuit which outputs the signal LGFB in a low level when the gate-source voltage of the transistor IL has not yet reached a predetermined voltage $V_{THL}'$ that is lower than the gate threshold voltage and on the other conditions it outputs the signal LGFB in a high level.

The input signal $S_{IN}$, the signals HGFB and LGFB, and the signal $S_{OUT\_L}$ are inputted to the gate control signal generation circuit 4. The input signal $S_{IN}$ is supplied to the input terminal 6. The signals HGFB and LGFB are from the circuits 3H and 3L. The signal $S_{OUT\_L}$ is from the output detection circuit 5.

The gate control signal generation circuit 4 generates and outputs the gate control signals HGCTL and LGCTL according to the input signal $S_{IN}$, which is supplied to the input terminal 6, indicating which of the transistors 1H and 1L is set to be on state. The input signal $S_{IN}$ in a high level serves as a signal indicating that the transistor 1H is set to be on state and the transistor 1L is set to be off state, and the input signal $S_{IN}$ in a low level serves as a signal indicating that the transistor 1H is set to fee off state and the transistor 1L is set to be on state. Thus, the gate control signal generation circuit 4 basically outputs the gate control signal HGCTL in a high level to the driver circuit 2H and outputs the gate control signal LGCTL in a low level to the driver circuit 2L when the input signal $S_{IN}$ is in a high level. Accordingly, the transistor 1H is set to on state and the transistor 1L is set to off state. Conversely, the gate control signal generation circuit 4 outputs the gate control signal HGCTL in a low level to the driver circuit 2H and outputs the gate control signal LGCTL in a high level to the driver circuit 2L when the input signal $S_{IN}$ is in a low-level. Accordingly, the transistor 1H is set to off state and the transistor 1L is set to on state.

In order to prevent the transistors 1H and 1L from being turned on simultaneously, the gate control signal generation circuit 4 sets the dead time period with reference to the feedback signals HGFB and LGFB. During the dead time period, the transistors 1H and 1L are simultaneously in off state. Hence, in the circuit 4, a measure of minimizing the dead time period is taken by using the signal $S_{OUT\_L}$ from the output detection circuit 5, with associated details to be described in the following.

In the half-bridge circuit 1 including the transistors 1H and 1L, a state in which the transistor 1H is in on state and the transistor 1L is in off state is referred to an output-on state, and a period of becoming the output-on state is referred to as an output-on period. Similarly, a state in which the transistor 1H is off state and the transistor 1L is on slate is referred to as an output-off state, and a period of becoming the output-off state is referred to as an output-off period. A dead time period is placed between the output-off period and the output-on period.

In the output-on state, the output signal $S_{OUT}$ in the output terminal 7 becomes a high level substantially the same or approximately the same as the potential of the supply voltage Vin; in the output-off state, the output signal $S_{OUT}$ in the output terminal 7 becomes a low level substantially the same or approximately the same as the potential of the ground.

Figure 2:
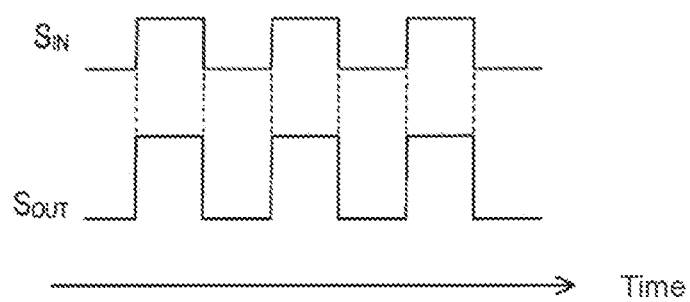
FIG. 2 is a brief waveform diagram of an input signal and an output signal in the bridge output circuit of FIG. 1.

As shown in FIG. 2, the input signal $S_{IN}$ is a signal in a rectangular wave alternating between a low level and a high level, and hence the output signal $S_{OUT}$ also becomes a signal in a rectangular wave alternating in a low level and a high level according to the level of the input signal $S_{IN}$.

The output detection circuit 5 detects the level of the output signal $S_{OUT}$, and generates and outputs an output detection signal $S_{OUT\_L}$ indicating a detection result thereof. Specifically, for example, the output detection circuit 5 compares the level of the output signal $S_{OUT}$ with a predetermined output determination level, and outputs the output detection signal $S_{OUT\_L}$ in a high level when the level of the output signal $S_{OUT}$ is determined as being below the output determination level, or outputs the output detection signal $S_{OUT\_L}$ in a low level when the output signal $S_{OUT}$ is determined as not being below the output determination level. In the output-on state the output detection signal $S_{OUT\_L}$ is as being in a low level and in the output-off state the output detection signal $S_{OUT\_L}$ is as being in a high level, and the output determination level has a predetermined positive voltage value (e.g., 1 V) lower than the supply voltage Vin.

The output detection signal $S_{OUT\_L}$ in a low level serves as a signal indicating that the half-bridge circuit 1 is in the output-on state, and the output detection signal $S_{OUT\_L}$ in a high level serves as a signal indicating that the half-bridge circuit 1 is in the output-off state. Therefore, the output detection circuit 5 may be considered as a circuit for detecting whether the half-bridge circuit 1 is in the output-on state, or be considered as a circuit for detecting whether the half-bridge circuit 1 is in the output-off state.

First to fifth embodiments are given below for illustrating structure, action, application and variation examples of a bridge output circuit BB in detail on the basis of the above content. Unless otherwise specified and without any contradiction, the above matters are applied to the first to fifth embodiments below, and the description of the above content prevail over the matters in the first to fifth embodiments that are, if any, contradictory to the above content. Further, without any contradiction, the matters given in any embodiment among the first to fifth embodiments in the description below may also be applied to any other embodiment (i.e., any two or more embodiments among the first to fifth embodiments may be combined).

First Embodiment

Figure 3:
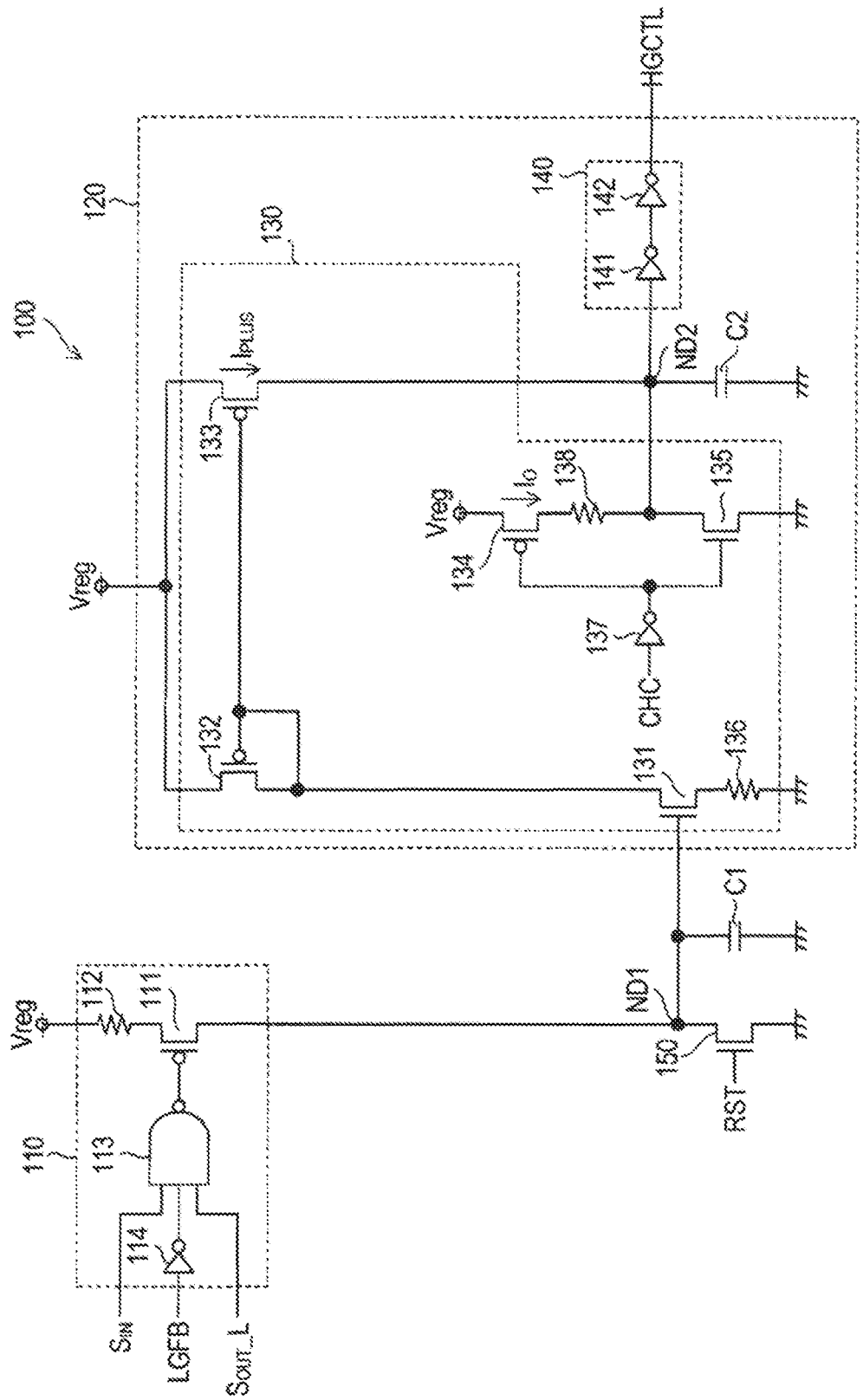
FIG. 3 is a circuit diagram of a dead time adjustment circuit provided in a gate control signal generation circuit of FIG. 1.

The first embodiment is described below. FIG. 3 shows a circuit diagram of a dead time adjustment circuit 100 included in the gate control signal generation circuit 4. The dead time adjustment circuit 100 includes an adjustment current output circuit 110, a delay circuit 120, a capacitor C1 and a transistor 150. The adjustment current output circuit 110 includes components referred to by numerals 111 to 114. The delay circuit 120 includes a charging current supply circuit 130 having components referred to by numerals 131 to 138, an output circuit 140 including inverter circuits 141 and 142, and a capacitor C2. A charging-discharging control signal generation circuit 160 (referring to FIG. 4(a)) also includes components included in the charging current supply circuit 130.

Transistors 131, 135 and 150 are configured as N-type MOSFETs, and the transistors 111, 132, 133 and 134 are configured as P-type MOSFETs.

The connection relationship of the components of the dead time adjustment circuit 100 is described below. The signal LGFB is inputted to an inverter circuit 114 to generate an inverted signal (a logically inverted signal) of the signal LGFB. A NAND circuit 113 is a negative logic product circuit having three terminals including first to third input terminals, the input signal $S_{IN}$ is inputted to the first input terminal of the NAND circuit 113, the inverted signal of the signal LGFB is inputted to the second input terminal of the NAND circuit 113 through the inverter circuit 114, and the signal $S_{OUT\_L}$ is inputted to the third input terminal of the NAND circuit 113. An output terminal of the NAND circuit 113 is connected to the gate of the transistor 111.

The source of the transistor 111 is connected to a terminal applied with an internal supply voltage Vreg through a resistor 112, and the drain of the transistor 111 is connected to a node ND1 commonly connected to one terminal of tint capacitor C1 and the gate of the transistor 131. The other terminal of the capacitor C1 is grounded. The internal supply voltage Vreg is a predetermined positive direct-current voltage (e.g., 5 V). The internal supply voltage Vreg is, for example, generated based on the input voltage Vin by an internal supply voltage generation circuit (not shown) provided in the bridge output circuit BB or provided in a device having the bridge output circuit BB. Further, the drain of the transistor 150 is connected to the node ND1, the source of the transistor 150 is grounded, and a reset signal RST is inputted to the gate of the transistor 150.

The internal supply voltage Vreg is applied to the sources of the transistors 132 and 133, and the gate and the drain of the transistor 132 are commonly connected to the gate of the transistor 133. The drains of the transistors 131 and 132 are connected to each other, and the source of the transistor 131 is grounded through a resistor 136. The drain of the transistor 133 is connected to one terminal of a capacitor C2 at the node ND2, and the other terminal of the capacitor C2 is grounded.

The internal supply voltage Vreg is applied to the source of the transistor 134, and the drain of the transistor 134 is connected to the node ND2 through a resistor 138. The node ND2 is also connected to the drain of the transistor 135, and the source of the transistor 135 is grounded. A charging/discharging control signal CHC is inputted to an input terminal of the inverter circuit 137 and an output terminal of the inverter circuit 137 is connected to the gates of the transistors 134 and 135. Further, the node ND2 is connected to an input terminal of the inverter circuit 141, and an output terminal of the inverter circuit 141 is connected to an input terminal of the inverter circuit 142. An output signal of the inverter circuit 142 becomes the signal HGCTL.

The actions and the function of the dead time adjustment circuit 100 are described below. Further, the gate control signal generation circuit 4 may perform a reset process at a necessary timing such as when the bridge output circuit B is activated. In the reset process, a reset signal RST in a high level is supplied to the gate of the transistor 150, and two terminals of the capacitor C1 are shorted accordingly through the transistor 150, and the terminal voltage (i.e., the voltage between the two terminals of the capacitor C1) of the capacitor C1 becomes zero V. After a certain period subsequent to the reset process, the reset signal RST in a low level is continuously supplied to the gate of the transistor 150. Unless otherwise specified below, the reset signal RST set to a low level is continuously supplied to the gate of the transistor 150.

In the adjustment current output circuit 110, the NAND circuit 113 supplies a signal in a low level to the gate of the transistor 111 to set the transistor 111 to on state only when the input signals to the first to third input terminals of the NAND circuit 113 are all in a high level. When the input signals supplied to the first to the third input terminals of the NAND circuit 113 include one signal in a low level, the signal in a high level supplied from the NAND circuit 113 to the gate of the transistor 111 sets the transistor 111 to off state. Thus, it may be considered that, the adjustment current output circuit 110 is a circuit that supplies an adjustment current to the capacitor C1 during a period in which a predetermined condition JJ is satisfied, wherein the predetermined condition JJ is satisfied when the signal $S_{IN}$ in a high level, the signal LGFB is in a low level and the signal $S_{OUT\_L}$ is in a high level. Each time when the predetermined condition JJ is satisfied, the adjustment current is supplied to the capacitor C1. In the circuit of FIG. 3, the transistor 111 becomes on state whenever the predetermined condition JJ is satisfied, and the adjustment current is supplied from the terminal applied with the internal supply voltage Vreg to the capacitor C1 through the resistor 112 and the transistor 111, and the terminal voltage (i.e., the voltage between the two terminals) of the capacitor C1 then rises. However, the terminal voltage of the capacitor C1 is limited to rise to no higher than the internal supply voltage Vreg, and the terminal voltage of the capacitor C1 does not exceed the internal supply voltage Vreg.

The terminal voltage of the capacitor C1 is supplied to the gate of the transistor 131. When the terminal voltage of the capacitor C1 exceeds the gate threshold voltage (the gate cutoff voltage) of the transistor 131, the drain current will flow to the transistor 131. The drain current is specified by the terminal voltage of the capacitor C1, the gate threshold voltage of the transistor 131 and the resistance value of the resistor 136. The drain current of the transistor 131 increases as the terminal voltage of the capacitor C1 increases. Since a current mirror circuit is formed by the transistors 132 and 133, a current $I_{PLUS}$ directly proportional to the drain current of the transistor 131 serves as the drain current of the transistor 133 to flow. Hence, as the terminal voltage of the capacitor C1 increases, the drain current of the transistor 131 also increases as the current $I_{PLUS}$ increases. However, as it may be understood from the circuit structure of FIG. 3, the current $I_{PLUS}$ does not flow when the voltage at the node ND2 has reached the internal supply voltage Vreg.

Figure 4A:
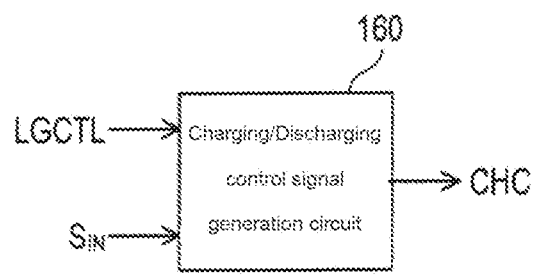
FIGS. 4(a) and 4(b) are diagrams of a generation block and waveforms of signals used in the dead time adjustment circuit of FIG. 3.
Figure 4B:
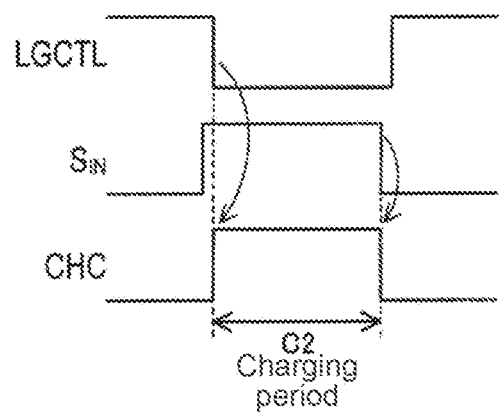

The charging/discharging control signal CHC inputted to the inverter circuit 137 is generated by the charging/discharging control signal generation circuit 160 of FIG. 4(a) according to the signals LGCTL and $S_{IN}$. FIG. 4(b) depicts the relationship of the signals LGCTL and $S_{IN}$ with the signal CHC. The signal $S_{IN}$ alternates between a low-level and a high level and the signal LGCTL accordingly alternates between a high level and a low level. In consideration of setting a state in which the signal LGCTL in a high level and the signal $S_{IN}$ in a low level as a starting point, a rising edge of the signal is first generated, the rising edge of the signal $S_{IN}$ is received, and the circuit 4 switches the signal LGCTL from a high level to a low level. Then, a falling edge of the signal $S_{IN}$ is generated, the falling edge of the signal $S_{IN}$ is received, and the circuit 4 switches the signal LGCTL from a low level to a high level. The circuit 166 is, for example, a logic circuit, which receives the falling edge of the signal LGCTL and switches the signal CHC from a low level to a high level. Then, the falling edge of the signal $S_{IN}$ is received, and the signal CHC is switched from a high level to a low level. Given that the condition above is satisfied, the specific structure of the circuit 160 may be any as desired.

When the signal CHC is in a low level the signal in a high level substantially consistent with the potential of the internal supply voltage Vreg is supplied from the inverter circuit 137 to the gates of the transistors 134 and 135, and the transistor 134 becomes off state and the transistor 135 becomes on state. Thus, when the signal CHC is in a low level, the two terminals of the capacitor C2 are shorted through the transistor 135, and the voltage at the node ND2 becomes 0 V.

Then, when the signal CHC becomes a high level, the signal in a low level substantially in 0 V is supplied from the inverter circuit 137 to the gates of the transistors 134 and 135, and the transistor 134 becomes on suite and the transistor 135 becomes off state. Thus, a current $I_O$ flows to the node ND2 from the terminal applied with the internal supply voltage Vreg through the transistor 134 and the resistor 138. The value of tire current $I_O$ is specified by a voltage difference between the internal supply voltage Vreg and the node ND2, and the resistance value of the resistor 138.

A period in which tire signal CHC becomes a high level is referred to as a "C2 charging period" (sec FIG. 4(b)). In the C2 charging period, the current $I_O$ and the current $I_{PLUS}$ corresponding to the terminal voltage of the capacitor C1 are supplied to the capacitor C2 so as to charge the capacitor C2. However, as it may be understood from the circuit structure in FIG. 3, when the voltage at the node ND2 has reached the internal supply voltage Vreg, the currents $I_O$ and $I_{PLUS}$ do not flow, and the current $I_{PLUS}$ is zero according to the terminal voltage of the capacitor C1. Once the signal CHC becomes a high level, when the signal CHC is to become a low level, the transistor 135 becomes on stale as described above. Thus, the stored charge in the capacitor C2 is discharged through the transistor 135, and the voltage at the node ND2 rapidly becomes 0 V.

The output circuit 140 is a circuit outputs the signal HGCTL in a high level when the voltage at the node ND2 consistent with the terminal voltage (i.e., the voltage between the two terminals of the capacitor C2) of the capacitor C2 becomes more than a predetermined determination voltage, and on the other conditions the output circuit 140 outputs the signal HGCTL in a low level. The determination voltage herein is a positive voltage lower than the internal supply voltage Vreg; when the internal supply voltage Vreg is 5 V, the determination voltage may be, for example, 2 V. In FIG. 3, the output circuit 140 consists of two inverter circuits 141 and 142, and the output circuit 140 may also be formed by one single buffer circuit.

Figure 5:
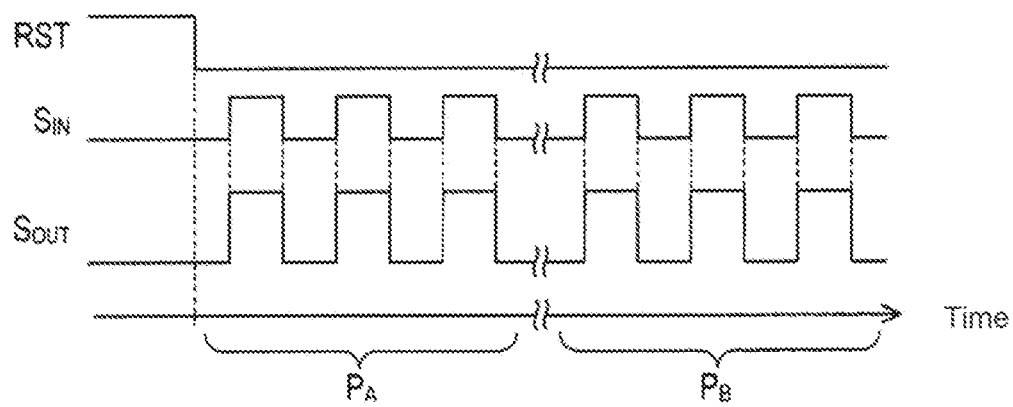
FIG. 5 is a diagram of two periods used for illustrations.

Referring to FIG. 5, a period $P_A$ shortly after the bridge output circuit BB is activated, and a period $P_B$ after a sufficient time subsequent to activating the bridge output circuit BB are described below, it is set that the reset signal RST becomes a high level and the terminal voltage of the capacitor C1 becomes 0 V before the period $P_A$, a falling edge is generated in the reset signal RST simultaneously when the period $P_A$ begins, and then the reset signal RST is kept in a low level after that. From the starting point of the period $P_A$, the input signal alternating between a low level and a high level is continuously supplied to the input terminal 6 of the bridge output circuit BB.

Figure 6:
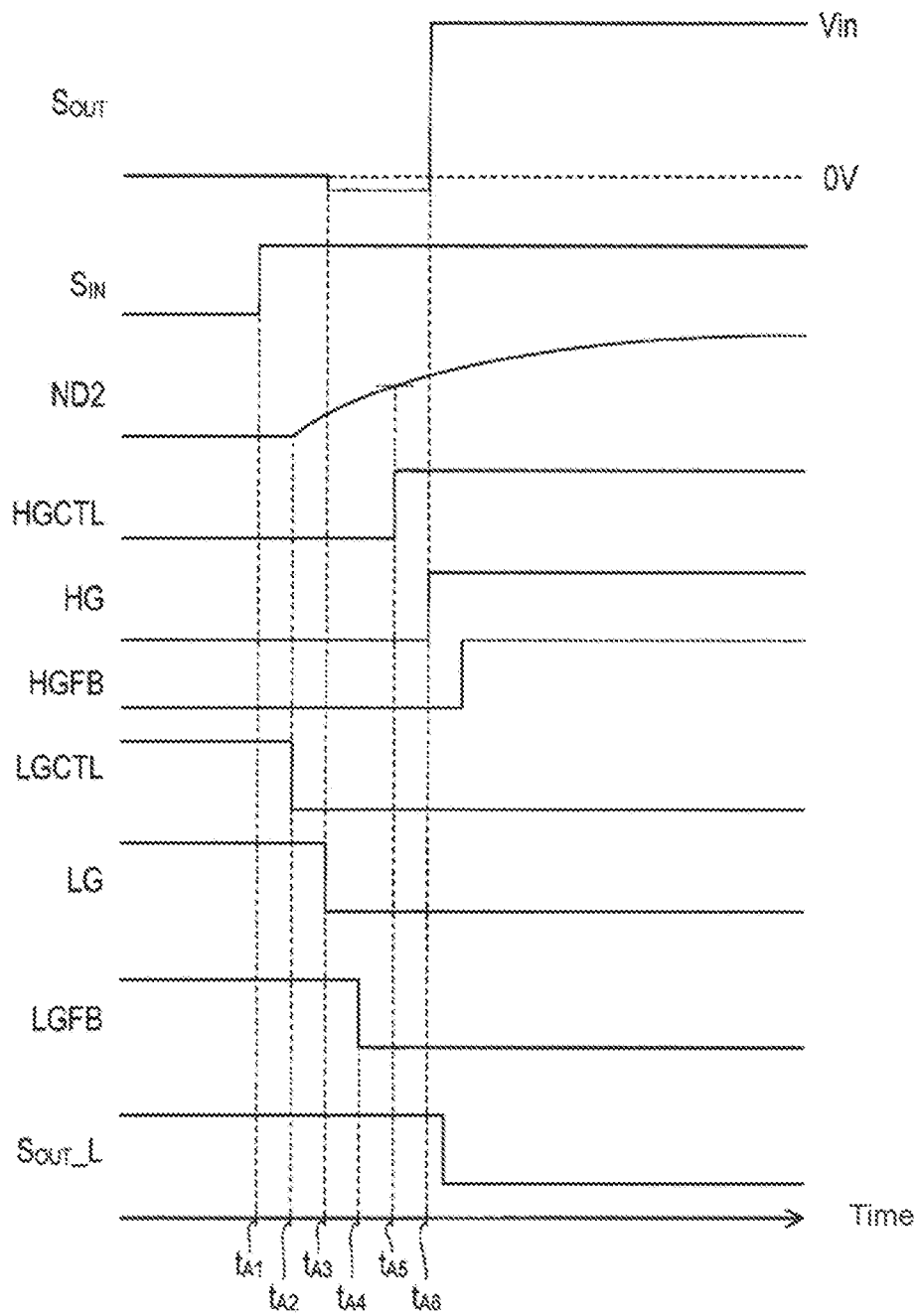
FIG. 6 is a waveform diagram of signals near a rising edge of an input signal shortly after the bridge output circuit is activated.

FIG. 6 shows waveforms of signals in response to a rising edge of the signal $S_{IN}$ in the period $P_A$. Timings $t_{41}$ to $t_{46}$ are timings within the period $P_A$, and the timings $t_{41}$, $t_{42}$, $t_{43}$, $t_{44}$, $t_{45}$ and $t_{46}$ sequentially arrive as the time passes. Before the timing $t_{41}$, the signal $S_{IN}$ is in a low level, and according to the signal $S_{IN}$ in a low level, the signals HGCTL, HG and HGFB are in a low level, the signals LGCTL, LG and LGFB are in a high level, the output signal $S_{OUT}$ is in a low level (0 V) and the signal $S_{OUT\_L}$ becomes a high level.

At the timing $t_{41}$, the input signal $S_{IN}$ switches from a low level to a high level. When the gate control signal generation circuit 4 receives the switching of the input signal $S_{IN}$ from a low level to a high level, it switches the control signal LGCTL from a high level to a low level without any delay at the timing $t_{42}$ in order to turn off the transistor 1L. When the driver circuit 2L receives the switching of the control signal LGCTL from a high level to a low level, it switches the gate signal LG from a high level to a low level without delay at the timing $t_{43}$. When the state detection circuit 3L receives the switching of the gale signal LG from a high level to a low level it switches the feedback signal LGFB from a high level to a low level without delay at the timing $t_{44}$.

On the other hand, by the action of the dead time adjustment circuit 100 setting the timing $t_{42}$ as the starting point, the control signal HGCTL switches from a low level to a high level at the timing $t_{45}$ (details of the action of the circuit 100 setting the liming $t_{42}$ as the starting point are to be described below). When the driver circuit 2H receives the switching of the control signal HGCTL from a low level to a high level, it switches the gate signal HG from a low level to a high level without any delay at the liming $t_{46}$. When the state detection circuit 3H receives the switching of the gate signal HG from a low level to a high level, it switches the feedback signal HGFB from a low level to a high level without any delay.

At timing $t_{46}$, the output signal $S_{OUT}$ switches from a low level to a high level (the level of the supply voltage Vin) as tire transistor 1H is turned on. Influenced accordingly, the output detection signal $S_{OUT\_L}$ switches from a high level to a low level.

A period between the timings $t_{43}$ and $t_{46}$ is equivalent to a dead time period in which the transistors 1H and 1L are simultaneously turned on. In FIG. 6, it is assumed that an inductive load to which the current flown from the output terminal 7 is supplied is connected to the output terminal 7. Thus, in the dead time period between the timings and $t_{46}$, the current flows from the parasitic diode ILD to the inductive load, and therefore the voltage of the signal $S_{OUT}$ is lower than 0 V only in proportion to the forward voltage of the parasitic diode ILD.

Figure 7:
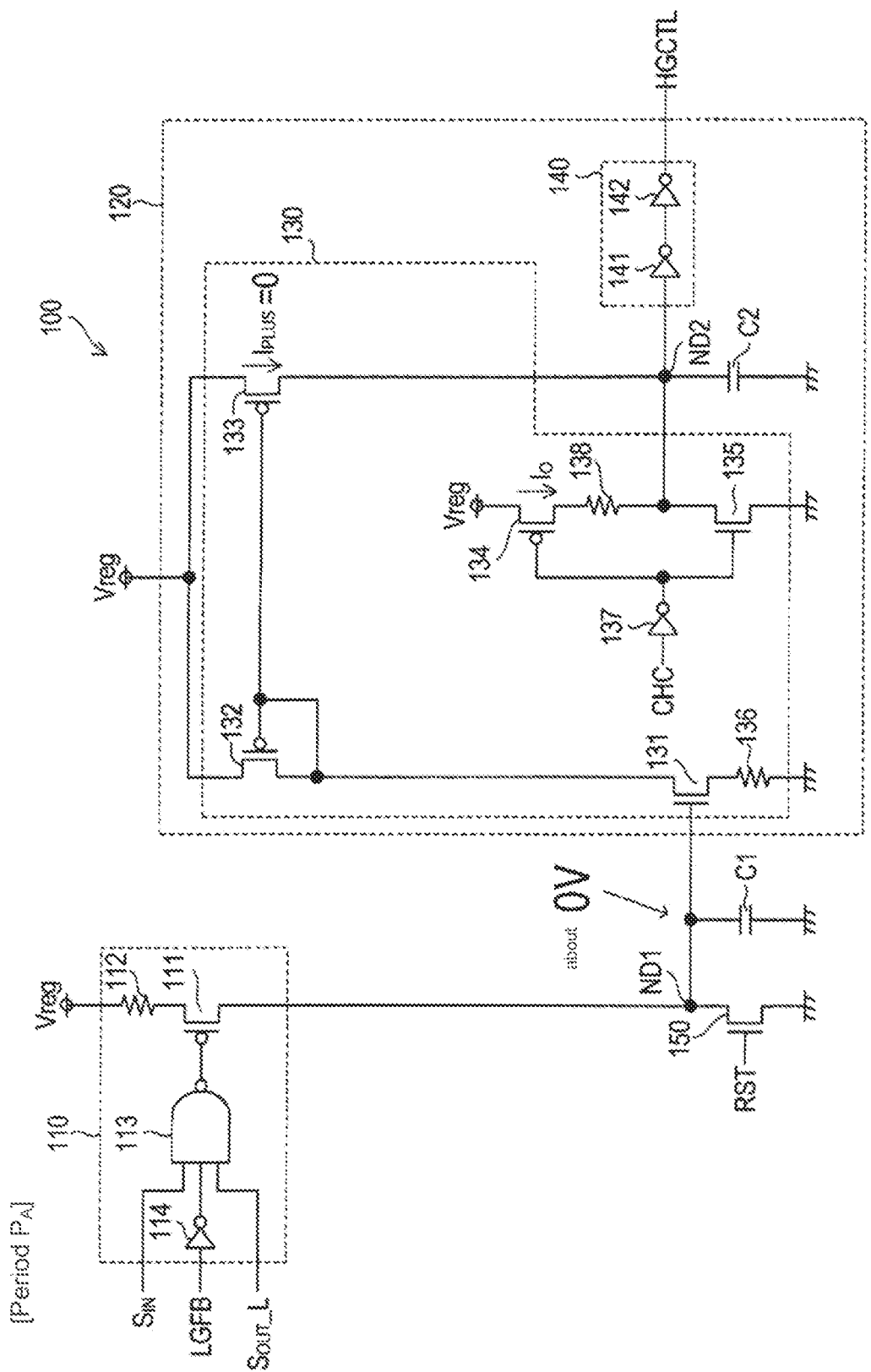
FIG. 7 is a diagram illustrating states of components shortly after the bridge output circuit is activated.

Referring to FIG. 7, the actions of the dead tune adjustment circuit 100 in response to the rising edge of the signal $S_{IN}$ in the period $P_A$ are described below. In the period $P_A$, during the period between the timings $t_{44}$ and $t_{46}$ near the rising edge of the signal $S_{IN}$ (referring to FIG. 6), the signal $S_{IN}$ is in a high level, the signal LGFB is in a low level and the signal $S_{OUT\_L}$ is in a high level. Thus, the predetermined condition JJ is established, and during the period in which the predetermined condition JJ is established, the transistor 111 is turned on, and the terminal applied with the internal supply voltage Vreg supplies the adjustment current through the resistor 112 and the transistor 111 to the capacitor C1. However, in the period $P_A$ shortly after the reset process is terminated, the terminal voltage of the capacitor C1 substantially is 0 V or close to 0 V, such that the current does not flow to the transistor 131. Therefore, the current $I_{PLUS}$ is also zero.

On the other hand, the current $I_O$ (referring to FIG. 3 and FIG. 4(b)) is supplied from the timing along the falling edge of the signal LGCTL consistent with the timing $t_{42}$ to the capacitor C2, and the voltage of the node ND2 rises. Then, at the timing $t_{45}$, the voltage at the node ND2 reaches the determination voltage (e.g., 2 V) in the output circuit 140, and a rising edge is generated in the signal HGCTL (referring to FIG. 6).

As such, in the period $P_A$, a rising edge in the signal HGCTL is generated at a timing after a certain initial time specified by the resistance value of the resistor 138 and the electrostatic capacitance value of the capacitor C2 from the timing $t_{42}$. The initial time above is designed to prevent the transistors 1H and 1L from being simultaneously turned on in the period $P_A$. Further, the timing $t_{45}$ of the rising edge of the control signal HGCTL is later than the timing $t_{44}$ of the falling edge of the signal LGFB, but the timing $t_{45}$ may be simultaneous with or before the timing $t_{44}$. However, preferably, the timing $t_{45}$ is later than the timing $t_{43}$.

In the period $P_A$ and after the period $P_A$, each time a rising edge of the signal $S_{IN}$ is generated, the adjustment current is supplied to the capacitor C1 during a period in which the predetermined condition JJ is established, and the terminal voltage of the capacitor C1 gradually rises. Along with the increase in the terminal voltage of the capacitor C1, the current $I_{PLUS}$ increases, and the rising speed of the terminal voltage of the capacitor C2 during the C2 charging period (FIG. 4(b)) also increases. Thus, the time from the timing of the falling edge of the signal LGCTL (the starting timing of the C2 charging period) to the timing of the rising edge of the signal HGCTL is reduced, and such reduction in time persists until the predetermined condition JJ is no longer established. The period $P_B$ is a period after the reduction proceeds until the predetermined condition JJ is no longer established.

Figure 8:
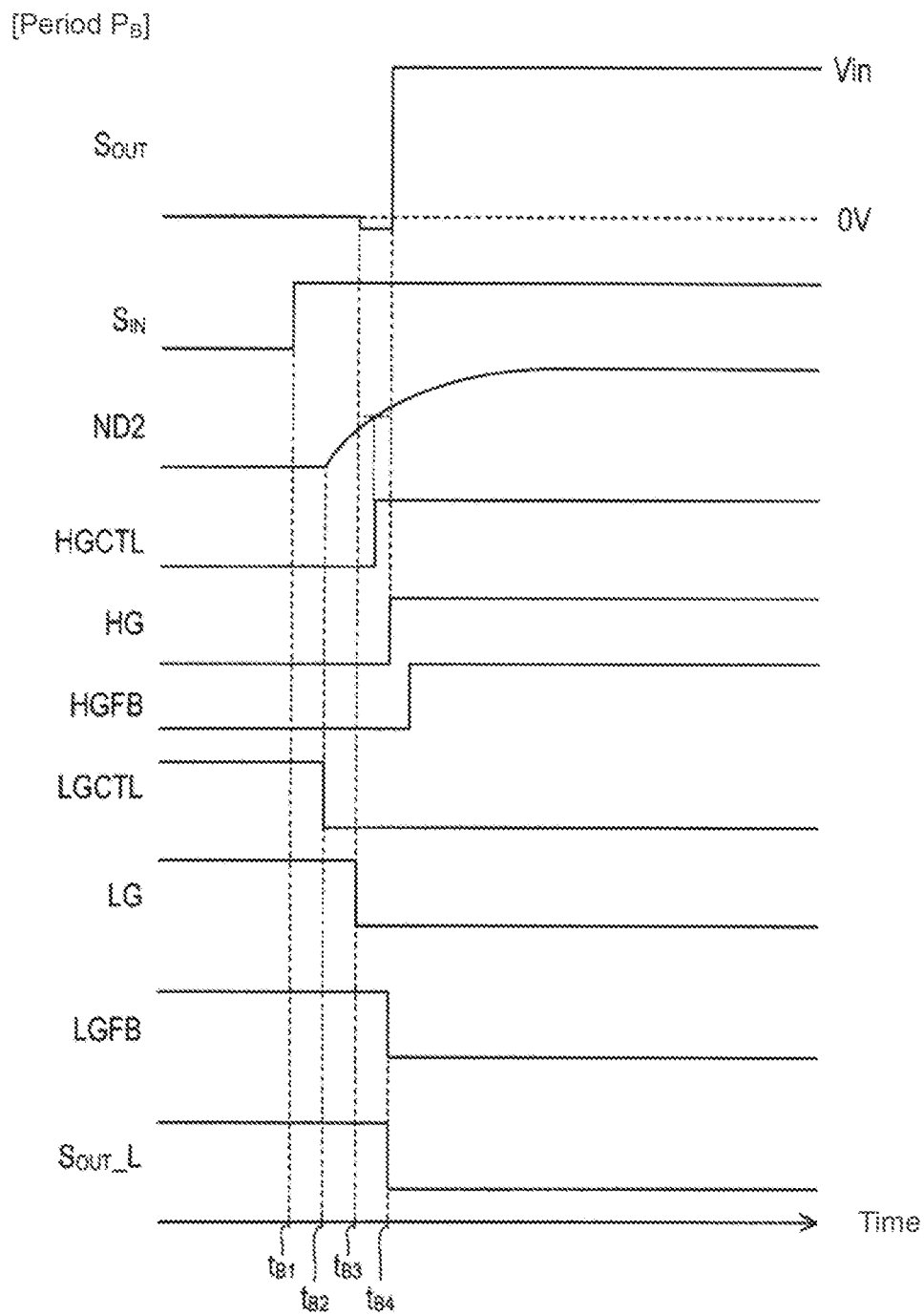
FIG. 8 is a waveform diagram of signals near a rising edge of an input signal after a sufficient time after the bridge output circuit is activated.

FIG. 8 shows waveforms of signals in response to a rising edge of the signal $S_{IN}$, the period $P_B$. Timings $t_{B1}$ to $t_{B2}$ are timings in the period $P_B$, and the timings $t_{B1}$, $t_{B2}$, $t_{B3}$ and $t_{B4}$ sequentially arrive as the time passes. Before the timing $t_{B1}$, the signal $S_{IN}$ is in a low level, and according to the signal $S_{IN}$ in a low level, the signals HGCTL, HG and HGFB are in a low level, the signals LGCTL, LG and LGFB are in a high level, the output signal $S_{OUT}$ is in a low level (0 V), and the signal $S_{OUT\_L}$ becomes a high level.

At the timing $t_{B1}$, the input signal $S_{IN}$ switches from a low level to a high level. When the gate control signal generation circuit 4 receives the switching operation of the input signal $S_{IN}$ from a low level to a high level, it switches the control signal LGCTL from a high level to a low level without any delay at the timing $t_{B2}$ in order to turn off the transistor 1L. When the driver circuit 2L receives the switching operation of the control signal LGCTL from a high level to a low level, it switches the gate signal LG from a high level to a low level without any delay at the timing $t_B$. When the state detection circuit 3L receives the switching operation of the gate signal LG from a high level to a low level it switches the feedback signal LGFB from a high level to a low level without any delay at the timing $t_{B4}$.

On the other hand, by the action of the dead time adjustment circuit 100 setting the timing $t_{B2}$ as the starting point, after the timing $t_{B2}$, the control signal HGCTL is switched from a low level to a high level. When the driver circuit 2H receives the switching operation of the control signal HGCTL from a low level to a high level, it switches the gate signal HG from a low level to a high level without any delay. When the state detection circuit 3H receives the switching operation of the gate signal HG from a low level to a high level, it switches the feedback signal HGFB from a low level to a high level without any delay.

The output signal $S_{OUT}$ switches from a low level to a high level (the level of the supply voltage Vin) as the transistor 1H is turned on along with the rising edge of the gate signal HG. Accordingly, the output detection signal switches from a high level to a low level.

In the period $P_B$, the terminal voltage of the capacitor C1 is stabilized at a certain voltage value and the current $I_{PLUS}$ is also stabilized at a certain current value, until the predetermined condition JJ is no longer established. Starting from the timing of the falling edge of the signal LGCTL consistent with the timing $t_{B2}$, a combined current of the current $I_O$ and the current $I_{PLUS}$ (referring to FIG. 3 and FIG. 4(b)) is supplied to the capacitor C2, and the voltage at the node ND2 rises in a speed faster than that in the period $P_A$. Further, a rising edge in the HGCTL is generated when the voltage at the node ND2 reaches the determination voltage (e.g., 2 V) in the output circuit 140.

The period in which the predetermined condition JJ is established, that is, the period in which the signal $S_{IN}$ is in a high level, the signal LGFB is in a low level and the signal $S_{OUT\_L}$ is in a high level, is equivalent to a period in which it is indicated that the transistor 1H is set to be on state by using by the signal $S_{IN}$ and that the transistor 1L is set to be off state by using the signal LGFB but the output signal $S_{OUT}$ becomes a low level (i.e., the transistor 1H has not become on state). This period is a dead time, and hence needs be reduced. However, the duration of the period in which the predetermined condition JJ is established is still dependent on constant differences of circuit components or the ambient temperature, and changes accordingly instead of remaining the same. The dead time adjustment circuit 100 in FIG. 3 may reduce and eventually eliminate the period in which the predetermined condition JJ is established. Thus, the dead time may be appropriately reduced by means of being irrelevant to the constant differences of circuit components or the ambient temperature, with the aim of reducing the loss associated with the dead time by shortening the dead time (the dead time period).

Figure 9:
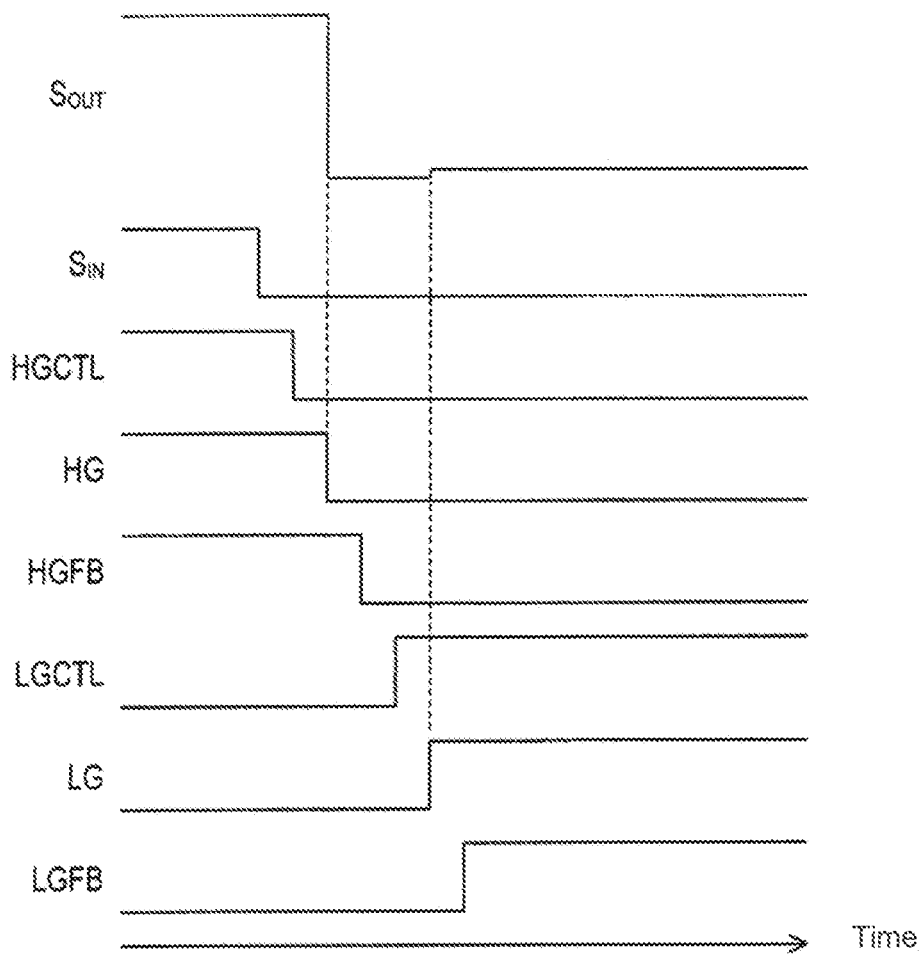
FIG. 9 is a waveform diagram of signals near a falling edge of an input signal of the bridge output circuit.

FIG. 9 shows waveforms of signals in response to a falling edge of the signal $S_{IN}$. Actions in response to the falling edge of the signal $S_{IN}$ are the same in the period $P_A$ and the period $P_B$. Before the timing of the falling edge of the signal $S_{IN}$, the signal $S_{IN}$ is in a high level, and according to the signal $S_{IN}$ in a high level, the signals HGCTL, HG and HGFB are in a high level, the signals LGCTL, LG and LGFB are in a low level and the output signal $S_{OUT}$ is in a high level.

When the gate control signal generation circuit 4 receives the switching operation of the input signal $S_{IN}$ from a high level to a low level, it switches the control signal HGCTL from a high level to a low level without any delay in order to turn off the transistor 1H. When the driver circuit 2H receives the switching operation of the control signal HGCTL from a high level to a low level, it switches the gate signal HG from a high level to a low level without any delay. When the state detection circuit 3H receives the switching operation of the gate signal HG from a high level to a low level, it switches the feedback signal HGFB from a high level to a low level without any delay.

When the gate control signal generation circuit 4 receives the switching operation of the feedback signal HGFB from a high level to a low level, it switches the control signal LGCTL from a low level to a high level without any delay in order to turn on the transistor 1L. When the driver circuit 2L receives the switching operation of the control signal LGCTL from a low level to a high level, it switches the gate signal LG from a low level to a high level without any delay. When the state detection circuit 3L receives the switching operation of the gate signal LG from a low level to a high level, it switches the feedback signal LGFB from a low level to a high level without any delay.

Second Embodiment

The second embodiment is described below. In the second embodiment, some technology variations related to the above structures and actions are described, and the bridge output circuit BB of the first embodiment is discussed.

In the input signal a high level is equivalent to a level (an output-on instruction level) indicating that the transistor 1H is set to be on state and the transistor 1L is set to be off state, and a low level is equivalent to a level (an output-off instruction level) indicating that the transistor 1H is set to be off state and the transistor 1L is set to be on state.

The dead time adjustment circuit 100 in FIG. 3 generates a rising edge of the gate control signal HGCTL at a timing subsequent to delaying the timing ($t_{A2}$, $t_{B2}$) of the falling edge of the gate control signal LGCTL by a time of a delay amount specified by various factors. That is to say, in the first embodiment, when the transistor 1H is in off state and the transistor 1L is in on state and the input signal $S_{IN}$ switches from a low level to a high level, the gate control signal generation circuit 4 generates and outputs the gate control signal LGCTL in a low level for sewing the transistor 1L to off state, and generates and outputs the gate control signal HGCTL in a high level for setting the transistor 1H to on state from a signal obtained by delaying the gate control signal LGCTL in a low level.

The dead time adjustment circuit 100 controls the delay amount equivalent to the difference between the timing of the falling edge of the gate control signal LGCTL and the timing of the rising edge of the gate control signal HGCTL according to the first to third delay control signals. In the structure of FIG. 3, the first to third delay control signals are respectively the signals $S_{IN}$, LGFB and $S_{OUT\_}L$ inputted to the adjustment current output circuit 110.

The dead time adjustment circuit 100 in FIG. 3 is configured to decrease the delay amount when the predetermined condition JJ is satisfied. More specifically, whenever the predetermined condition JJ satisfied, the adjustment current output circuit 110 supplies an adjustment current to the capacitor C1 through the transistor 111 during a period in which the predetermined condition JJ is satisfied, and updates the terminal voltage of the capacitor C1 accordingly. The delay amount is dependent on the terminal voltage of the capacitor C1 that determines the current $I_{PLUS}$. Thus, it is equivalent that the delay circuit 120 generates and outputs a signal used as the gate control signal HGCTL in a high level for setting the transistor 1H to on state, wherein the signal is a signal delayed the gate control signal LGCTL in a low level for setting the transistor 1L to off state by a time corresponding to the terminal voltage of the capacitor C1. In other words, the delay circuit 120 generates the rising edge of the gate control signal HGCTL at a timing after delaying the timing of the falling point of the gate control signal LGCTL by the time of the delay amount corresponding to the terminal voltage of the capacitor C1.

In the delay circuit 120, the charging current supply circuit 130 supplies, starting from the timing of switching the level of the gate control signal LGCTL from the level (high level) for setting the transistor 1L to on state to the level (low level) for setting the transistor 1L to off state, the predetermined current $I_O$ and the current $I_{PLUS}$ to the capacitor C2. The current $I_{PLUS}$ is corresponding to the terminal voltage of the capacitor C1. The output circuit 140 generates and outputs the gate control signal HGCTL according to the terminal voltage of the capacitor C2.

In the period $P_A$, the terminal voltage (i.e., the voltage between the two terminals) of the capacitor C1 and the predetermined initial voltage are consistent, and a delay amount and a predetermined initial delay amount are consistent. The delay amount is equivalent to the difference between the timing of the falling edge of the gate control signal LGCTL and the timing of the rising edge of the gate control signal HGCTL. The predetermined initial delay amount is equivalent to the interval between the time points $t_{42}$ and $t_{45}$ in FIG. 6. However, during the repeated transition between a high level and a low level of the input signal $S_{IN}$, when the accumulation amount of the adjustment current flowing through the capacitor C1 increases, the terminal voltage of the capacitor C1 then gradually deviates from the initial voltage. When the difference between the terminal voltage of the capacitor C1 and the initial voltage increases as the accumulation amount increases, then the delay amount gradually decreases from the initial delay amount. Further, as in the period $P_B$, during a period in which the predetermined condition JJ is no longer satisfied as the delay amount decreases, the terminal voltage of the capacitor C1 is constant and the delay amount is also constant.

In the structure of FIG. 3, the initial voltage is 0 V, and the adjustment current flow's to the capacitor C1 so as to charge the capacitor C1. However, the initial voltage may also be a voltage other than 0 V. When the initial voltage is a positive voltage, the dead time adjustment circuit 100 may also be modified as having the adjustment current flow in a direction for discharging the stored charge in the capacitor C1. Similarly, it may also be considered that, the terminal voltage (i.e., the voltage between the two terminals) of the capacitor C2 is set to a predetermined positive voltage at the timing of a falling edge of the gate control signal LGCTL, the dead time adjustment circuit 100 may be modified as having the currents $I_O$ and $I_{PLUS}$ flow toward a direction for discharging stored charge in the capacitor C2 from the timing of the falling edge. In this condition, given that a rising edge of the gate control signal HGCTL is generated, the terminal voltage (i.e., the voltage between the two terminals) of the capacitor C2 may gradually drop and hence become lower than the predetermined determination voltage as the discharging proceeds. In all conditions, the following stays constantly true: the terminal voltage of the capacitor C1 gradually deviates from the initial voltage when the accumulation amount of the adjustment current flowing through the capacitor C1 increases, the difference between the terminal voltage of the capacitor C1 and the initial voltage and the delay amount gradually decreases from the initial delay amount as the accumulation amount increases, and the terminal voltage of the capacitor C1 is constant and the delay amount is also constant when the period in which the predetermined condition JJ is satisfied is no longer generated as the delay amount decreases.

When the second delay control signal is a signal representing on/off state of the transistor 1L, it may also be a signal other than the gate control signal LGCTL. For example, the gate signal LG may lie used as the second delay control signal. In this condition, in the structure of FIG. 3, the signal LG for substitution of the signal LGFB is inputted to the inverter circuit 114.

When the third delay control signal is a signal representing a level of the output signal $S_{OUT}$, it may also be a signal other than the output detection signal $S_{OUT\_}L$. For example, the output signal $S_{OUT}$ may be used as the third delay control signal. In this condition, in the structure of FIG. 3, the output signal $S_{OUT}$ substitution for the output detection signal $S_{OUT\_}L$ is inputted to the adjustment current output circuit 110, a circuit that captures a digital signal in a high level when the output signal $S_{OUT}$ is below a predetermined output determination level and captures a digital signal in a low level when the output signal $S_{OUT}$ exceeds the predetermined output determination level is provided in the circuit 110, and the digital signal is inputted to the third input terminal of the NAND circuit 113. By means of having the input signal of the third input terminal of the NAND circuit 113 become a low level in the output-on state and become a high level in the output-off state, the output determination level has a predetermined positive voltage value (e.g., 1 V) even lower than the supply voltage Vin. Alternatively, a signal obtained from the signal $S_{OUT}$ passing through the inverter circuit may also be inputted to the third input terminal of the NAND circuit 113 (however, the inverter circuit here needs to have a withstand voltage more than the voltage Vin).

Alternatively, the third delay control signal may also be a signal representing on/off state of the transistor 1H. Thus, for example, any one of the signals HG, HGCTL and HGFB may be used as the third delay control signal. In this condition, in the structure of FIG. 3, any inverted signal (a logically inverted signal) of the signals HG, HGCTL and HGFB in substitution for the output detection signal $S_{OUT\_}L$ is inputted to the third input terminal of the NAND circuit 113.

In all conditions, the structure below is used. That is, when the input signal $S_{IN}$ serving as the first delay control signal indicates that the output-on state (i.e., for example, the input signal $S_{IN}$ is in a high level) is set, the second delay control signal indicates that the transistor 1L is in off state (i.e., for example, the signal LGFB or LG is in a low level), and the third delay control signal indicates that the level of the output signal $S_{OUT}$ is below the output determination level (i.e., for example, when the signal $S_{OUT\_}L$ is in a high level or the signal $S_{OUT}$ is in a low level) or the third delay control signal indicates that the transistor 1H is in off state (i.e., for example, the signal HG, HGCTL or HGFB is in a low level), the predetermined condition JJ is set as being established, and the adjustment current flows in the capacitor C1 by a direction of reducing the delay amount. The reason is that the period in which the predetermined condition JJ is established is equivalent to a period indicating that the transistor 1H is set as on state and the transistor 1L is in off state, and the transistor 1H is not in on state yet, and the period is dead time.

Third Embodiment

Figure 10:
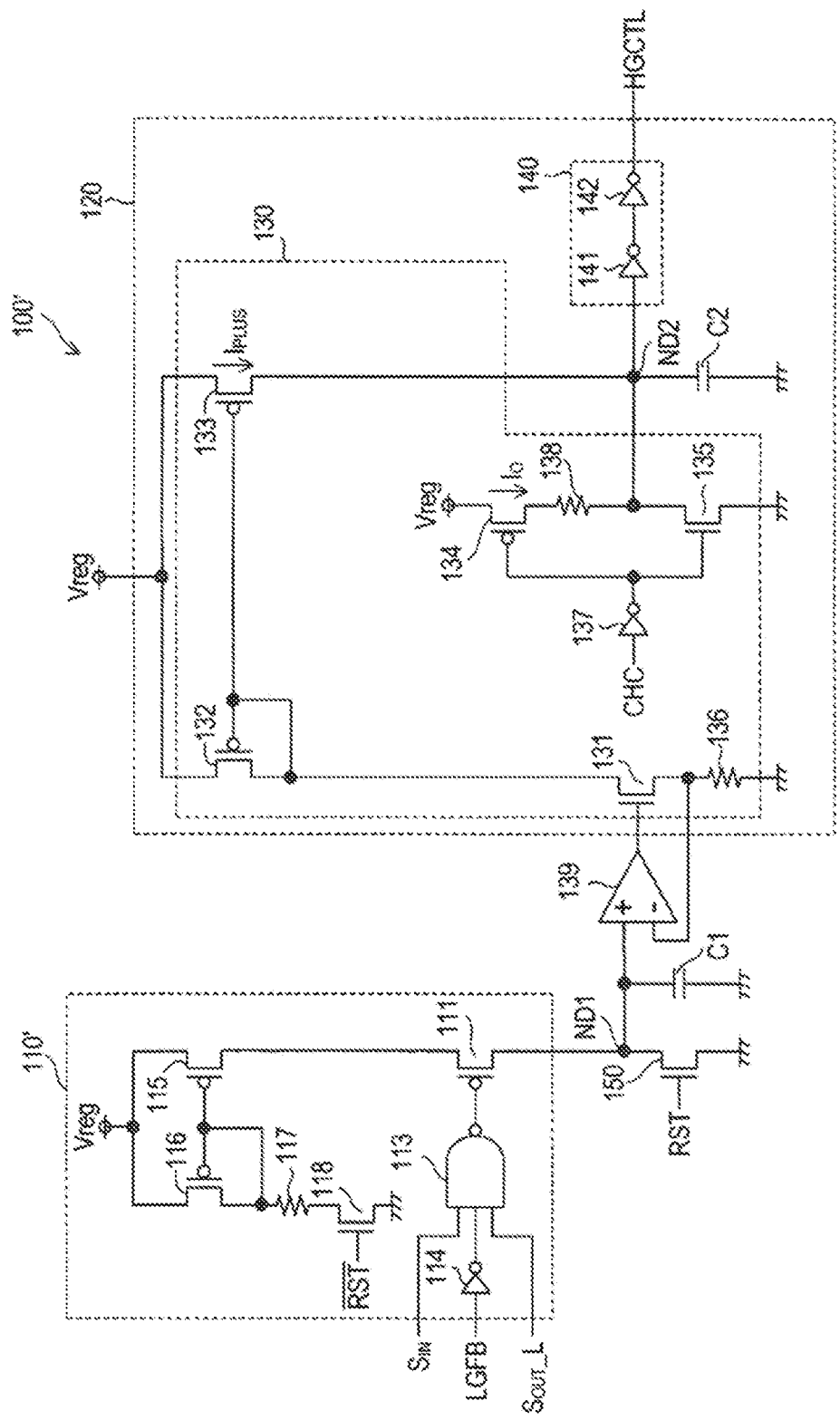
FIG. 10 is a variation circuit diagram of a dead time adjustment circuit according to a third embodiment of the present invention.

The third embodiment, is described below. Various modifications may be made to the dead time adjustment circuit 100 shown in FIG. 3, given that the above functions are satisfied. For example, FIG. 10 shows a dead time adjustment circuit 100' modified from the dead time adjustment circuit 100. The dead time adjustment circuit 100' observed from FIG. 10 differs from the dead time adjustment circuit 100 in FIG. 3 in a first aspect and a second aspect, and the circuit 100' is the same as the circuit 100 in other aspects. The first aspect is that an operational amplifier 139 is additionally provided in the dead time adjustment circuit 100'. The second aspect is that an adjustment current output circuit 110' in the dead time adjustment circuit 100' serves as the adjustment current output circuit 110. Further, only the portions concerning these different aspects are described, and the description for the same portions is omitted. Further, the modification with either one of the first aspect and the second aspect being implemented in the dead time adjustment circuit 100 is acceptable.

The first aspect is described below. In the dead time adjustment circuit 100', the drain of the transistor 111, the drain of the transistor 150 and the node ND1 mutually connected with one terminal of the capacitor C1 are not connected to the gate of the transistor 131, but are connected to a non-inverting input terminal of the operational amplifier 139. Moreover, an output terminal of the operational amplifier 139 is connected to the gate of the transistor 131, a connecting node of the source of the transistor 131 and one terminal of the resistor 136 is connected to an inverting input terminal of the operational amplifier 139. The other terminal of the resistor 136 is grounded.

In the dead time adjustment circuit 100' of FIG. 10, similar to the dead time adjustment circuit 100 in FIG. 3, the current $I_{PLUS}$ may be adjusted according to the terminal voltage of the capacitor C1. That is to say, in the dead time adjustment circuit 100', with the function of the operational amplifier 139, the drain current, which is specified by the terminal voltage of the capacitor C1 and the resistance value of the resistor 136, flows to the transistor 131, and the current $I_{PLUS}$, which is directly proportional to the drain current of the transistor 131, serves as the drain current of the transistor 133 to flow accordingly.

Further, in FIG. 10, it is depicted that the operational amplifier 139 is outside the delay circuit 120 but in the dead time adjustment circuit 100'. The operational amplifier 139 may be considered as a component in the delay circuit 120, and may also be considered as a component in the charging current supply circuit 130.

The second aspect is described below. In the adjustment current output circuit 110', a constant current source is provided in substitution to the resistor 112 in FIG. 3. More specifically, the adjustment current output circuit 110' in FIG. 10 includes components referred to by numerals 111, 113 and 114 to 118. The transistors 115 and 116 and the transistor 111 are similarly formed by P-channel MOSFETs. The transistor 118 is formed by an N-channel MOSFET. The actions and connection relationship of the transistor 111, the NAND circuit 113 and the inverter circuit 114 in the adjustment current output circuit 110' of FIG. 10 are the same as the actions and connection relationship in the adjustment current output circuit 110 of FIG. 3.

The drain of the transistor 111 is connected to the node ND1. On the other hand, the source of the transistor 111 is connected to the drain of the transistor 115. The sources of the transistors 115 and 116 are connected to a terminal applied with the internal supply voltage Vreg. The gate of the transistor 115 and the gate and the drain of the transistor 116 are commonly connected to one terminal of the resistor 117, and the other terminal of the resistor 117 is connected to the drain of the transistor 118. The source of the transistor 118 is grounded. An inverted signal of the reset signal RST is inputted to the gate of the transistor 118. Thus, when the above reset process is not performed (i.e., when the reset signal RST is in a low level), by using the condition that a signal in a high level is inputted to the gate of the transistor 118 such that the transistor 118 becomes on state and the transistor 111 also becomes on state, a constant current dependent on the resistance value of the resistor 117 passes through the transistor 111 and flows to the capacitor C1. Further, the above constant current does not flow when the transistor 111 is in off state. That is, a switching circuit with respect to a constant current source is formed in the adjustment current output circuit 110'.

Fourth Embodiment

The fourth embodiment is described below. In the fourth, embodiment, an application of using the above bridge output circuit BB in a switching power device is illustrated.

Figure 11:
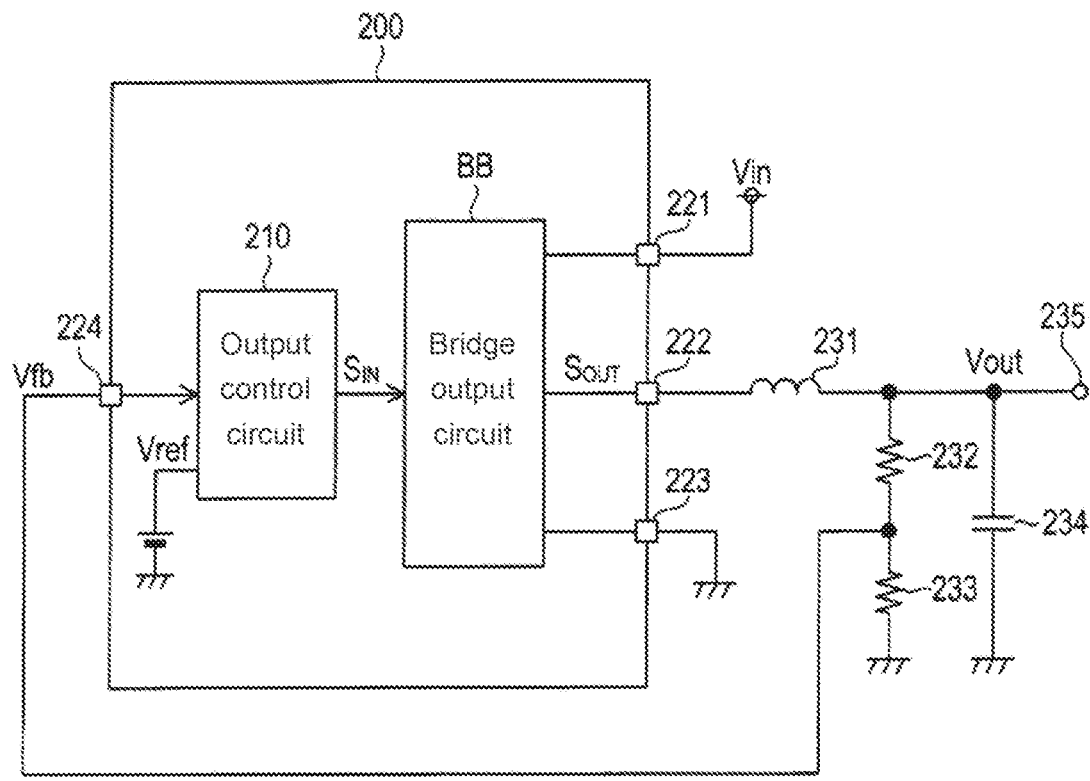
FIG. 11 is a structural diagram of a switching power device according to a fourth embodiment of the present invention.

FIG. 11 shows a structural diagram of a switching power device according to the fourth embodiment. The switching power device includes a switching power supply IC 200, and multiple discrete components externally installed and connected with respect to the switching power supply IC 200. The multiple discrete components include an inductor 231, resistors 232 and 233, and a capacitor 234. The switching power device in FIG. 11 is formed by a step-down switching power device for generating a required output voltage Vout from a required input voltage Vin. The input voltage Vin and the output voltage Vout are positive direct-current voltages, and the output voltage Vout is lower than the input voltage Vin. The output voltage Vout is presented at an output terminal 235 of the switching power device. Herein, the input voltage Vin is 12 V. By adjusting the resistance values of the resistors 232 and 233, the output voltage Vout is provided with a required positive voltage value (e.g., 1 V or 5 V) less than 12 V.

Figure 12:
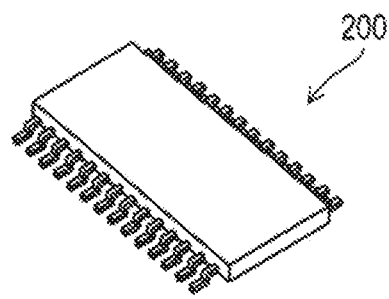
FIG. 12 is an appearance diagram of a switching power supply 1C according to the fourth embodiment of the present invention.

The switching power supply IC 200 is an electronic part formed by packaging the semiconductor integrated circuit such as shown in FIG. 12 in a housing (a package) made of resin. Multiple external terminals provided are exposed from the housing of IC 200, and the multiple external terminals include terminals 221 to 224 shown in FIG. 11. Terminals other than these terminals may also be included in the multiple external terminals above. Further, the quantity of the external terminals of IC 200 shown in FIG. 12 is only an example.

The bridge output circuit BB and an output control circuit 210 is provided in the switching power supply IC 200. The input voltage Vin is supplied to the terminal 221. The terminal 222 is equivalent to tire terminal 7 in FIG. 1, and thus the output signal $S_{OUT}$ of the bridge output circuit BB is outputted from the terminal 222. The terminal 223 is grounded. The terminal 222 is connected to one terminal of the inductor 231, and the other terminal of the inductor 231 is connected to the output terminal 235. The output terminal 235 is grounded through the capacitor 234, and on the other hand connected to one terminal of the resistor 232. The other terminal of the resistor 232 is grounded through the resistor 233. A divided voltage of the output voltage Vout is generated at a connecting node of the resistors 232 and 233, wherein the divided voltage serves as the feedback voltage Vfb and is applied to the terminal 224. The output control circuit 210 generates and outputs the input signal $S_{IN}$ with respect to the bridge output circuit BB (hence, the output control circuit 210 may be referred to as an input signal generation circuit) by the means of stabilizing the output voltage Vout with a target output voltage according to a predetermined reference voltage Vref and the feedback voltage Vfb generated in the IC 200 based on the input voltage Vin. The target output voltage is a voltage specified by a voltage dividing ratio (a voltage dividing ratio of the output voltage Vout) of the reference voltage Vref with respect to the resistors 232 and 233, and is a voltage for stabilizing the output voltage Vout. With the alternating output-on period in which the transistor 1H becomes on state and output-off period in which the transistor 1L becomes on state, serving as the output signal $S_{OUT}$, a switching voltage in rectangular waves is generated at the terminal 222, and the switching voltage passes through the inductor 231 and the capacitor 234 for rectification and smoothing, thereby obtaining the output voltage Vout.

The control means for stabilizing the target output voltage by using the output voltage Vout may be implemented by any control methods. For example, a control method of constant-on-time may be used in the output control circuit 210. The control method of constant-on-time is commonly known, and associated details are thus omitted herein. However, in this condition, the output control circuit 210 generates the signal $S_{IN}$ that becomes a high level at constant timings, such as the signal $S_{IN}$, between the timings of two adjacent rising edges of the signal $S_{IN}$. As a result, a current passes through the inductor 231 by alternating the output-on time having a fixed length and the output-off time having a variable length, so as to generate the output voltage Vout from the input voltage Vin.

Further, a voltage mode control method or a current mode control method may also be implemented in the output control circuit 210. For example, a pulse modulation signal may be generated by comparing a voltage corresponding to a difference between the reference voltage Vref and the feedback voltage Vfb with triangular waves, and the pulse modulation signal is set as the signal $S_{IN}$.

Figure 13:
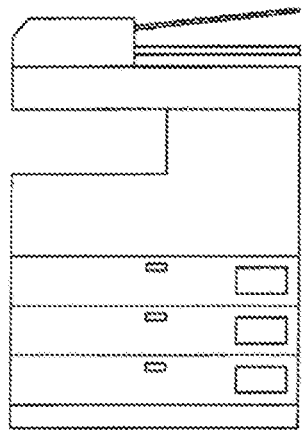
FIG. 13 is an appearance diagram of a copy machine according to the fourth embodiment of the present invention.

The switching power device having the bridge output circuit BB may be equipped in any type of electronic appliance, and is capable of using the output voltage Vout as a driving voltage for any function circuit in the electronic appliance. FIG. 13 shows an appearance diagram of a copy machine as an example of an electronic appliance equipped with a switching power device having the bridge output circuit BB. Further, for example, the electronic appliance equipped with the switching power device having the bridge output circuit BB may also be a cell phone (including, phones categorized as smartphones), a portable information terminal a tablet personal computer, a television receiver, a projector, a digital camera, an MP3 player, a step counter or a Bluetooth™ head-mounted call receiver.

Figure 14:
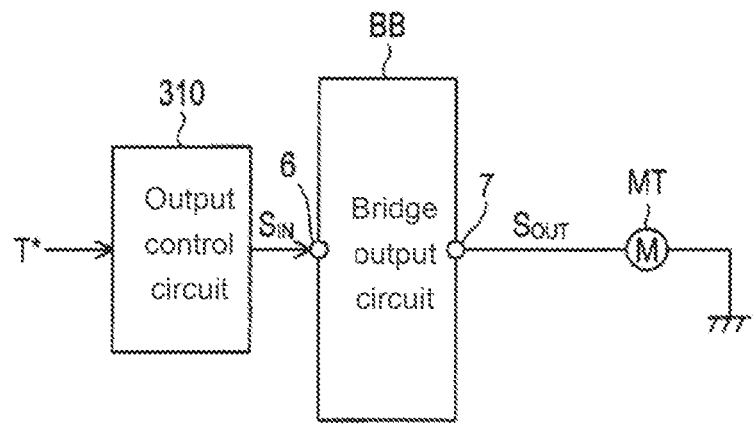
FIG. 14 is a structural diagram of a motor driver device according to the fourth embodiment of the present invention.
Figure 15:
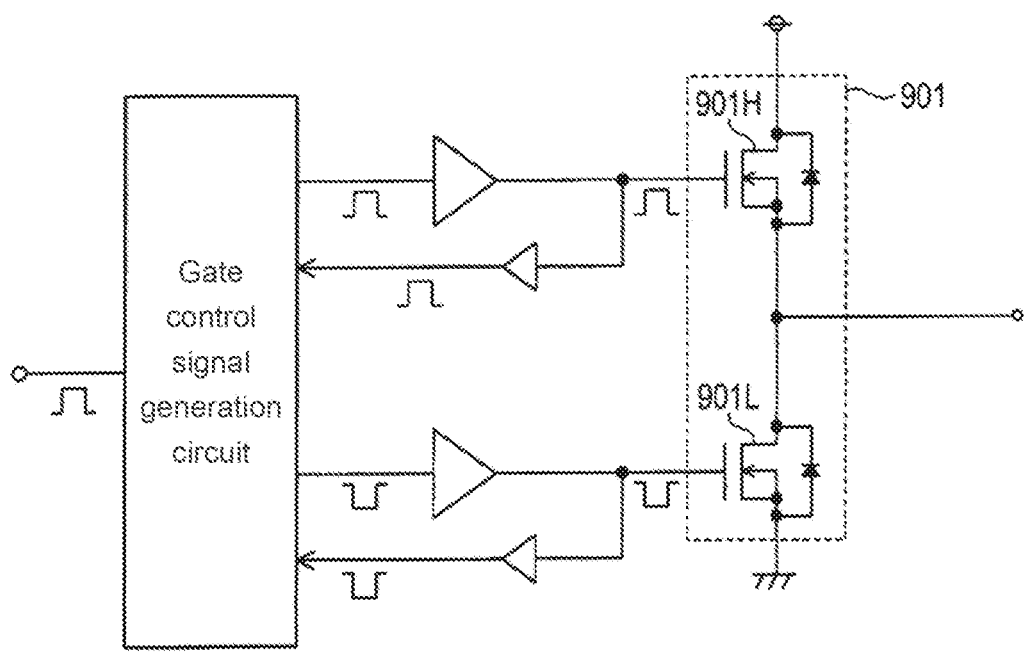
FIG. 15 is a structural diagram of a common bridge output circuit.

Moreover, the output signal $S_{OUT}$ of five bridge output circuit BB an also be directly supplied to any load. That is, for example, as shown in FIG. 14, the terminal 7 applied with the output signal $S_{OUT}$ is connected to a motor MT serving as a load, and the switching voltage serving as the output signal $S_{OUT}$ is supplied to the motor MT. In this condition, the output control circuit 310 and the bridge output circuit BB may form a motor driver device. The output control circuit 310 for example, may generate the input signal $S_{IN}$ of the bridge output circuit BB by a means of torque specified by the motor MT according to a torque instruction value T* of the torque generated by the motor MT (thus, the output control circuit 310 may be referred to as an input signal generation circuit). The torque instruction value T* may be generated in the motor driver device, or may be supplied to the motor driver device from an external appliance that is not shown.

Fifth Embodiment

The fifth embodiment is described below.

The components of the switching power supply IC 200 in FIG. 11 is formed in form of a semiconductor integrated circuit, and the semiconductor integrated circuit is packaged in a housing (a package) made of resin to form a semiconductor device. However, circuits equivalent to the circuits in the switching power supply IC 200 may also be formed by multiple discrete parts.

Moreover, the bridge output circuit BB in a single unit may also be formed in form of a semiconductor integrated circuit, and the semiconductor integrated circuit is packaged in a housing (a package) made of resin to form a semiconductor device.

In the half-bridge circuit 1 having the transistors 1H and 1L, the drain of the transistor 1H is connected to the first power terminal, and the source of the transistor 1L is connected to the second power terminal; however, the first power terminal and the second power terminal may be any terminals having a fixed potential. The potential of the first power terminal is higher than the potential of the second power terminal.

For any signals or voltages representing logical values, the relationship between the high level and the low level thereof may be opposite (i.e., a logical value "1" may be assigned with any of the high level or five low level), given that the subject above is not compromised.

The transistor 1H may also be formed by a P-channel MOSFET. In this condition, the level of the voltage supplied to the gate of the transistor 1H may be modified from the level above by implementing the switching control means above. The transistor 1L may also be configured as a P-channel MOSFET.

The transistors 1H and 1L may be any type of transistors as long as they are voltage-controlled transistors. The same applies to the transistor 131 in FIG. 3.

The transistors other than the transistors above may be any type of transistors. For example, a junction gate field-effect transistor (FET) or an insulated-gate bipolar transistor (IGBT) or bipolar transistor may be used in substitution for the transistor serving as the MOSFET in the description above. Any desired transistor has a first electrode, a second electrode and a control electrode. In the FET, one of the first and second electrodes is the drain and the other is the source, and the control electrode is the gate. In the IGBT, one of the first and second electrodes is the collector and the other is the emitter, and the control electrode is the gate. In a non-IGBT bipolar transistor, one of the first and second electrodes is the collector and the other is the emitter, and the control electrode is the base.

<<Discussion of the Present Invention>>

Specific discussion of the present invention is conducted by the above embodiments.

A bridge output circuit W according to an implementation form of the present invention is characterized by: being a bridge output circuit that receives the supply of the input signal ($S_{IN}$) and outputs an output signal ($S_{OUT}$) corresponding to the input signal from an output terminal; and including: a first transistor (1H), provided between a first power terminal and the output terminal; a second transistor (1L), provided between the output terminal and a second power terminal; a first detection circuit (3H), detecting on/off state of the first transistor according to a first gate signal (HG) serving as a gate signal of the first transistor and outputting a first detection signal (HGFB) indicative of a detection result; a second detection circuit (3L), detecting on/off state of the second transistor according to a second gate signal (LG) serving as a gate signal of the second transistor and outputting a second detection signal (LGFB) indicative of a detection result; a gate control signal generation circuit (4), generating a first gate control signal (HGCTL) and a second gate control signal (LGCTL) according to the input signal, the first detection signal and the second detection signal in a way that the first transistor and the second transistor do not simultaneously become on state; a first driver circuit (2H), supplying the first gate signal to the first transistor according to the first gate control signal; and a second driver circuit (2L), supplying the second gate signal to the second transistor according to the second gate control signal. Wherein, the input signal alternates between an output-on instruction level and an output-off instruction level, the output-on instruction level indicates that the first transistor is to be set to on-state and the second transistor is to be set to off state, and the output-off instruction level indicates that the first transistor is to be set to off state and the second transistor is to be set to on state. When the first transistor is in off state and the second transistor is in on state, the output-off instruction level is switching to the output-on instruction level in the input signal, the gate control signal generation circuit generates the second gate control signal (LGCTL in a low level in FIG. 6 and FIG. 8) for setting the second transistor to off state, generates the first gate control signal (HGCTL in a high level in FIG. 6 and FIG. 8) for setting the first transistor to on state from a signal obtained by delaying the second gate control signal for setting the second transistor to off state, and controls the time of delay, that is, a delay amount, according to a first delay control signal ($S_{OUT}$_L in FIG. 3) serving as the input signal, a second delay control signal (LGFB in FIG. 3) representing on/off state of the second transistor, and a third delay control signal ($S_{OUT}$_L in FIG. 3) representing the level of the output signal or on/off state of the first transistor.

The signal obtained from delaying the second gate control signal for setting the second transistor to off state is used to generate the first gate control signal for setting the first transistor to on state. At this point, the dead time may be appropriately reduced according to the first to third delay control signals.

More specifically, for example, preferably, in the bridge output circuit W, the gate control signal generation circuit is configured to cause the delay amount to decrease when the gate control signal generation circuit satisfies a predetermined condition (JJ), wherein the predetermined condition is satisfied when the input signal serving as the first delay control signal is the output-on instruction level, it is indicated that the second transistor is in off-state by using the second delay signal, and it is indicated that the level of the output signal is below a predetermined level or the first transistor is in off state by using the third delay control signal.

Considering that a period in which the predetermined condition is satisfied is equivalent to a period in which the first transistor should be set to on-state and the second transistor should be set to off state with however the first transistor not becoming on-state, the period is the dead time. When it is indicated that the period exists as the predetermined condition is satisfied, the delay amount decreases, with the aim of reducing the dead time.

More specifically, for example, in the bridge output circuit W, preferably, the gate control signal generation circuit (4) includes: an adjustment capacitor (C1); an adjustment current output circuit (110), rendering an adjustment current to flow through the adjustment capacitor during a period in which the predetermined condition is satisfied whenever the predetermined condition is satisfied, and accordingly updating the terminal voltage of the adjustment capacitor; and a delay circuit (120), generating the first gate control signal for setting the first transistor to on state from a signal obtained by delaying the second gate control signal for setting the second transistor to off state by a time corresponding to a terminal voltage of the adjustment capacitor.

More specifically, for example, in the bridge output circuit W, preferably, the delay circuit (120) includes: u delay capacitor (C2); and a circuit (130), supplying, starting from a timing of switching the level of the second gate control signal from the level for setting the second transistor to on state to the level for setting the second transistor to off state, a predetermined current ($I_O$) and a current corresponding to the terminal voltage of the adjustment capacitor to the delay capacitor, and generating the first gate control signal (HGCTL) according to the terminal voltage of the delay capacitor.

Various modifications within the scope of the technical concept disclosed by the claims may be appropriately made to the embodiments of the present invention. The embodiments are examples of embodiments of the present invention, and the terms and meanings of the components or the present invention are not limited to the contents described in the embodiments. The specific values recited in the description above are merely examples, and these values can be modified to various other values.

What is claimed is:

1. A bridge output circuit, receiving an input signal and outputting an output signal corresponding to the input signal from an output terminal, comprising:
   a first transistor, between a first power terminal and the output terminal;
   a second transistor, between the output terminal and a second power terminal;
   a first detection circuit, detecting on/off state of the first transistor according to a first gate signal serving as a gate signal of the first transistor, and outputting a first detection signal indicating detection result;
   a second detection circuit, detecting on/off state of the second transistor according to a second gate signal serving as a gate signal of the second transistor, and outputting a second detection signal indicating detection result;

a gate control signal generation circuit, generating a first gate control signal and a second gate control signal according to the input signal, the first detection signal and the second detection signal in a way that the first transistor and the second transistor do not simultaneously become on-state;

a first driver circuit, supplying the first gate signal to the first transistor according to the first gate control signal; and a second driver circuit, supplying the second gate signal to the second transistor according to the second gate control signal;

wherein, the input signal alternates between an output-on instruction level and an output-off instruction level, the output-on instruction level indicates that the first transistor is set to be on state and the second transistor is set to be off state, and the output-off instruction level indicates that the first transistor is set to be off state and the second transistor is set to be on state, when the first transistor is in off state and the second transistor is in on state, the output-off instruction level is switching to the output-on instruction level in the input signal, the gate control signal generation circuit generating the second gate control signal for setting the second transistor to off state, and generating the first gate control signal for setting the first transistor to on state from a signal that delayed the second gate control signal for setting the second transistor to off-state, and the gate control signal generation circuit controlling a time of the delay, that is a delay amount, according to a first delay control signal serving as the input signal, a second delay control signal indicating on/off state of the second transistor, and a third delay control signal indicating a level of the output signal or on/off state of the first transistor, wherein the gate control signal generation circuit is configured to decrease the delay amount when a predetermined condition is satisfied.

2. The bridge output circuit according to claim 1, wherein the predetermined condition is satisfied when the input signal serving as the first delay control signal is in the output-on instruction level, the second transistor is indicated as being in off state by the second delay control signal, and the level of the output signal is indicated as below a predetermined level or the first transistor is in off state by the third delay control signal.

3. The bridge output circuit according to claim 2, wherein the gate control signal generation circuit comprises:

an adjustment capacitor;

an adjustment current output circuit, updating a terminal voltage of the adjustment capacitor by having an adjustment current flow through the adjustment capacitor during a period that the predetermined condition is satisfied; and a delay circuit, generating the first gate control signal for setting the first transistor to on state from a signal, the signal delayed the second gate control signal for setting the second transistor to off state by a time responding to the terminal voltage of the adjustment capacitor.

4. The bridge output circuit according to claim 3, wherein the delay circuit comprises:

a delay capacitor; and a circuit, supplying a predetermined current and a current corresponding to the terminal voltage of the adjustment capacitor to the delay capacitor from a timing of a level of the second gate control signal is switched from the level for setting the second transistor to on state to the level for setting the second transistor to off state, and the delay circuit generating the first gate control signal according to the terminal voltage of the delay capacitor.

5. The bridge output circuit according to claim 3, wherein the delay circuit decreases the delay amount from a predetermined initial delay amount following the terminal voltage of the adjustment capacitor deviates from a predetermined initial voltage as an accumulation amount of the adjustment current flowing through the adjustment capacitor increases.

6. The bridge output circuit according to claim 4, wherein the delay circuit decreases the delay amount from a predetermined initial delay amount following the terminal voltage of the adjustment capacitor deviates from a predetermined initial voltage as an accumulation amount of the adjustment current flowing through the adjustment capacitor increases.

7. The bridge output circuit according to claim 5, wherein: when the period that the predetermined condition is satisfied is generated decreasingly as the delay amount decreases, the terminal voltage of the adjustment capacitor is fixed and the delay amount is fixed.

8. The bridge output circuit according to claim 1, wherein the first driver circuit receives the first gate control signal for setting the first transistor to off state or on state, and supplies the first gate signal to the first transistor; and the second driver circuit receives the second gate control signal for setting the second transistor to off state or on state, and supplies the second gate signal to the second transistor.

9. A semiconductor device, forming the bridge output circuit according to claim 1, the bridge output circuit being formed by an integrated circuit.

10. A power device, comprising:

the bridge output circuit according to claim 1; and an input signal generation circuit, generating the input signal according to a feedback voltage corresponding to a direct-current output voltage, wherein the direct-current output voltage is generated from a switching voltage that is the output signal of the bridge output circuit.

11. A semiconductor device, forming the power device according to claim 10, the power device being formed by an integrated circuit.

* * * * *